United States Patent [19]
Yoshimoto et al.

[11] Patent Number: 5,611,129
[45] Date of Patent: Mar. 18, 1997

[54] METHOD OF MAKING A PACKAGED PIEZOELECTRIC OSCILLATOR

[75] Inventors: Hisaya Yoshimoto; Shigeru Kambara; Ikuo Matsumoto, all of Kyoto, Japan

[73] Assignee: Rohm Co., Ltd., Kyoto, Japan

[21] Appl. No.: 470,038

[22] Filed: Jun. 6, 1995

Related U.S. Application Data

[62] Division of Ser. No. 293,922, Aug. 22, 1994, Pat. No. 5,506,463.

[30] Foreign Application Priority Data

| Aug. 23, 1993 | [JP] | Japan | 5-208075 |
| Mar. 29, 1994 | [JP] | Japan | 6-059202 |
| Mar. 29, 1994 | [JP] | Japan | 6-059203 |
| Mar. 29, 1994 | [JP] | Japan | 6-059204 |
| Mar. 29, 1994 | [JP] | Japan | 6-059205 |
| Mar. 29, 1994 | [JP] | Japan | 6-059206 |
| Mar. 30, 1994 | [JP] | Japan | 6-060587 |
| Mar. 31, 1994 | [JP] | Japan | 6-062536 |

[51] Int. Cl.$^6$ ............................................. H01L 41/22
[52] U.S. Cl. ............................................ 29/25.35; 29/855
[58] Field of Search ............................. 29/25.35, 855; 310/320, 344, 348

[56] References Cited

U.S. PATENT DOCUMENTS

| 2,326,923 | 8/1943 | Bokovoy | 310/344 X |
| 2,440,064 | 4/1948 | Arnold et al. | 310/348 |
| 4,464,598 | 8/1984 | Besson et al. | 310/344 |
| 4,532,451 | 7/1985 | Inoue | 310/353 |
| 4,703,218 | 10/1987 | Takahashi et al. | 310/348 |
| 4,825,117 | 4/1989 | Thomas, III et al. | 310/344 X |
| 4,992,693 | 2/1991 | Kishi et al. | 310/348 |

FOREIGN PATENT DOCUMENTS 2105710  4/1990  Japan .

*Primary Examiner*—Carl E. Hall
*Attorney, Agent, or Firm*—Michael D. Bednarek; Kilpatrick & Cody, L.L.P.

[57] ABSTRACT

A packaged piezoelectric oscillator is provided which comprises an insulating package body, a piezoelectric element, and a lid member. The package body has an upwardly open housing groove which has a bottom surface formed with oscillator electrodes at both ends of the housing groove. The piezoelectric element is fixedly received in the housing groove of the insulating package body and held in electrical conduction with the respective oscillator electrodes. The lid member is attached to the package body to close the housing groove. The housing groove has an intermediate wider width portion, and each end of the housing groove is provided with a pair of end positioning walls projecting toward each other for providing a narrower width portion between the pair of end positioning walls.

7 Claims, 20 Drawing Sheets

METHOD OF MAKING A PACKAGED PIEZOELECTRIC OSCILLATOR

This application is a division of application Ser. No. 08/293,922 filed Aug. 22, 1994, now U.S. Pat. No. 5,506,463.

BACKGROUND OF THE INVENTION

1. Field of the Invention

This invention relates to a piezoelectric oscillator of the type which comprises a piezoelectric element enclosed in an insulating package. The present invention also relates to a method of making a plurality of such oscillators at a time.

2. Description of the Related Art

A packaged piezoelectric oscillator is disclosed in Japanese Patent Application Laid-open No. 2(1990)-105710 for example. The oscillator of this laid-open Japanese application comprises a package body made or an insulating material such as synthetic resin and having an upwardly open housing groove for receiving a piezoelectric element, The bottom surface of the housing groove is formed at both ends with a pair of oscillator electrodes in electrical conduction with the piezoelectric element, and the oscillator electrodes are also connected to lead electrodes extending out of the package body. The oscillator further comprises a lid member attached to the package body from above to close the housing groove.

According to the prior art, the housing groove of the package body is rendered wider than the piezoelectric element for facilitating insertion of the latter into the former. However, due to such dimensional relation, the piezoelectric element may positionally or angularly deviate widthwise (sidewise) relative to the housing groove.

It has been found that the oscillation characteristics of the piezoelectric oscillator may be distorted if the piezoelectric element is improperly positioned within the housing groove. It has been also found that the oscillation characteristics of the improperly positioned piezoelectric element may deteriorate in a shorter time than a properly positioned piezoelectric element.

SUMMARY OF THE INVENTION

It is, therefore, an object of the present invention to provide a packaged piezoelectric oscillator which is capable of preventing a positional deviation of a piezoelectric element within an insulating package body.

Another object of the present invention is to provide a method of making a plurality of packaged piezoelectric oscillators at one time at a low cost.

According to one aspect of the present invention, there is provided a packaged piezoelectric oscillator comprising: an insulating package body having an upwardly open housing groove which has a bottom surface formed with oscillator electrodes at both ends of the housing groove; a piezoelectric element fixedly received in the housing groove of the insulating package body and held in electrical conduction with the respective oscillator electrodes; and a lid member attached to the package body to close the housing groove; wherein the housing groove has an intermediate wider width portion, each end of the housing groove being provided with a pair of end positioning walls projecting toward each other for providing a narrower width portion between the pair of end positioning walls.

Apparently, the end positioning walls are effective for preventing the piezoelectric element from deviating sidewise. Preferably, the pair of end positioning walls may be inclined so that the narrower width portion at said each end of the housing groove tapers downward. In the latter case, the piezoelectric element is guided by the inclined positioning walls to an optimum position.

The piezoelectric element may be fixed to the oscillator electrodes within the housing groove by deposits of a relatively soft electrically conductive adhesive. The soft adhesive deposits provide a buffering effect against thermal stresses and strains.

The lid member may have an upper surface formed entirely with an electrically insulating layer. In this case, it is preferable that the insulating layer differs in color from the lid member and is formed with at least one indication cutout. Further, it is also advantageous if the insulating layer is nearly equal in coefficient of thermal expansion to the lid member, thereby preventing thermal bending due to a difference in thermal expansion between the insulating layer and the lid member.

The lid member may be attached to the package body by a bonding layer which includes conductive portions at positions corresponding to the respective lead electrodes, and non-conductive portions at positions clear of the lead electrodes. The conductive portions of the bonding layer may be made of a electrically conductive resin or a solder paste, whereas the non-conductive portions may be made of a thermoplastic resin adhesive.

Alternaively, the bonding layer may be entirely made of an anisotropic pressure sensitive conductive elastomer, in which case the bonding layer is rendered electrically conductive by predetermined compression only at the conductive portions. The details of the anisotropic pressure sensitive conductive elastomer will be described hereinafter.

The package body may comprise a plurality of electrode forming portions made of a metal-platable resin, and a plurality of non-electrode forming portions arranged alternately with the electrode forming portions and made of a non-platable resin. In this case, the lead electrodes and the oscillator electrodes are selectively formed only on the electrode forming portions of the package body even if the package body as a whole is subjected to plating with a metal.

According to another aspect of the present invention, there is provided a method of making packaged piezoelectric oscillators comprising the steps of: preparing a resinous master package plate formed with a plurality of upwardly open housing grooves, each of the housing grooves being flanked by at least first and second pairs of through-holes penetrating the master package plate, the first and second pairs of through-holes being located at positons corresponding to both ends of said each housing groove; forming first and second lead electrodes extending on upper and lower surfaces of the master package plate transversely of said each housing groove respectively at the first and second pairs of through-holes, the first and second lead electrodes further extending respectively within the first and second pairs of through-holes, the first and second lead electrodes further extending into said each housing groove; forming oscillator electrodes on a bottom surface of said each housing groove respectively at both ends thereof in electrical conduction with the first and second lead electrodes; mounting a piezoelectric element in said each housing groove in electrical conduction with the respective oscillator electrodes; attaching a master lid plate to the master package plate to close said each housing groove; and cutting the master package plate together with the attached master lid plate to provide a plurality of packaged piezoelectric oscillators.

The preparation of the master package plate may comprise a primary molding step of forming a plurality of electrode forming portions made of a metal-platable resin and spaced from each other, and a secondary molding step of forming a plurality of non-electrode forming portions made of a non-platable resin and arranged alternately with the electrode forming portions. Alternatively, the preparation of the master package plate may comprise a primary molding step of forming a plurality of non-electrode forming portions made of a non-platable resin and spaced from each other, and a secondary molding step of forming a plurality of electrode forming portions made of a metal-platable resin and arranged alternately with the electrode forming portions.

Other objects, features and advantages of the present invention will be fully understood from the following detailed description given with reference to the accompanying drawings.

DETAILED DESCRIPTION OF THE PREFERRED EMBODIMENTS

Figure 1:
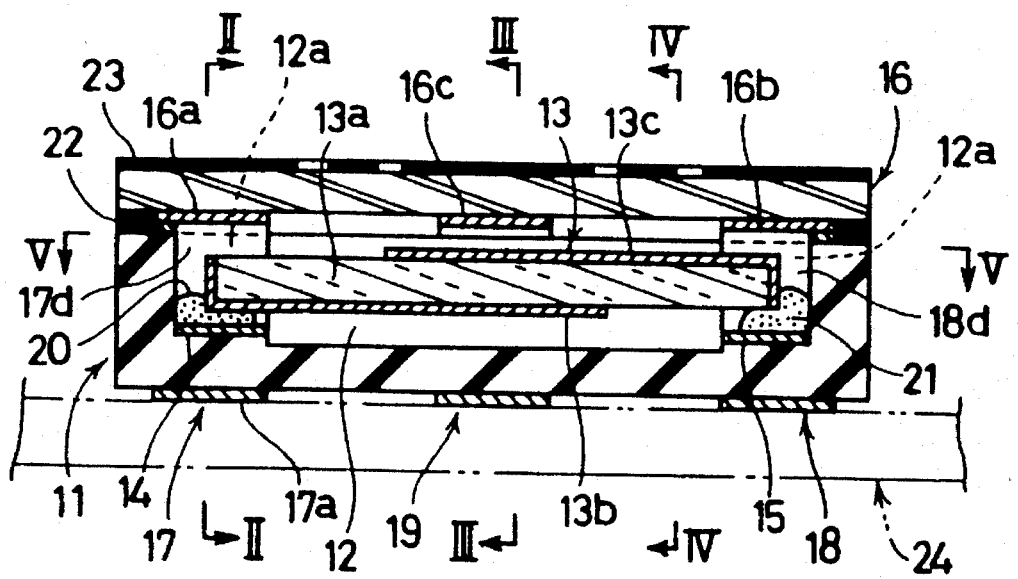
FIG. 1 is a view, in longitudinal section, showing a packaged piezoelectric oscillator according to a first embodiment of the present invention.
Figure 2:
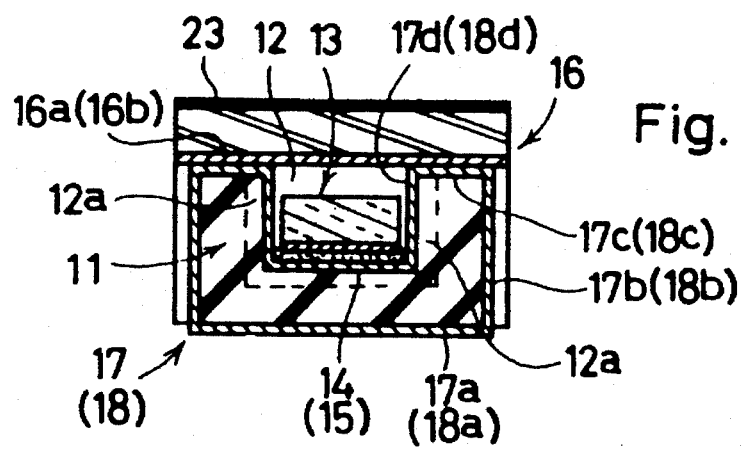
FIG. 2 is a sectional view taken on lines II—II in FIG. 1.
Figure 3:
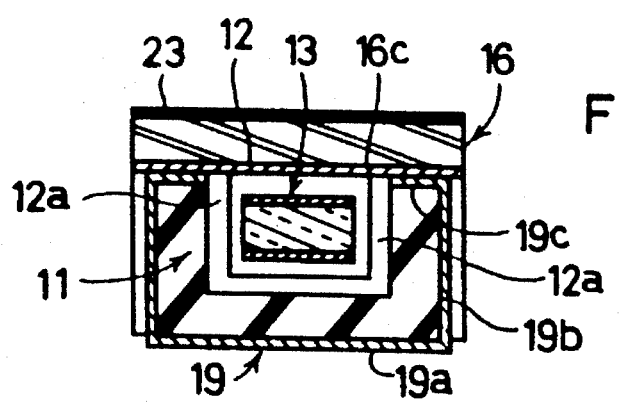
FIG. 3 is a sectional view taken on lines III—III in FIG. 1.
Figure 4:
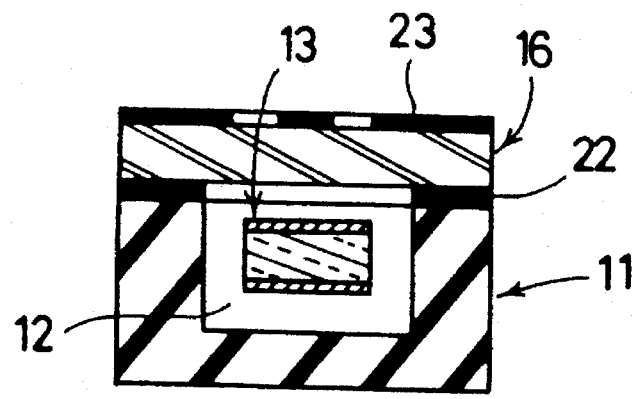
FIG. 4 is a sectional view taken on lines IV—IV in FIG. 1.

Referring first to FIGS. 1 to 6 of the accompanying drawings, there is shown a packaged piezoelectric oscillator according to a first embodiment of the present invention. The oscillator mainly comprises a package body 11, a piezoelectric element 13, and a lid member 16.

The package body 11 is a rectangular block which is made of an insulating material such as epoxy resin. The package body 11 has an upwardly open housing groove 12. The bottom surface of the groove 12 is formed with film-like oscillator electrodes 14, 15 respectively at both ends of the groove 12.

The package body 11 is further formed with three film-like lead electrodes which are spaced from each other longitudinally of the package body 11 and include a pair of end lead electrodes 17, 18 (first and second lead electrodes) and an intermediate lead electrode 19 (third lead electrode). Each of the end lead electrodes 17, 18 is electrically connected to a corresponding one of the oscillator electrodes 14, 15 at the bottom of the package body 11, and comprises an external bottom film portion 17a, 18a, a pair of external side film portions 17b, 18b, a pair of external top film portions 17c, 18c, and a pair of internal side film portions 17d, 18d. The intermediate lead electrode 19 comprises an external bottom film portion 19a, a pair of external side film portions 19b, and a pair of external top film portions 19c.

The piezoelectric element 13 is accommodated in the housing groove 12 of the package body 11. The piezoelectric element 13 comprises a ceramic bar 13a, a lower electrode film 13b formed on the bottom face of the ceramic bar 13a to extend onto one end face of the bar, and an upper electrode film 13c formed on the ceramic bar 13a to extend onto the other end face of the bar. The lower electrode film 13b is electrically connected to the oscillator electrode 14 by a deposit 20 of electrically conductive adhesive, whereas the upper electrode film 13c is electrically connected to the other oscillator electrode 15 by another deposit 21 of electrically conductive adhesive. Apparently, the piezoelectric element 13 is fixed in place within the housing groove 12 by the respective adhesive deposits 20, 21.

Preferably, the electrically conductive adhesive deposits 20, 21 may be made of a relatively soft resin such as thermoplastic resin or silicone resin. In this case, the flexibility or elasticity of the soft resin absorbs or buffers a difference in thermal expansion between the package body 11 and the piezoelectric element 13, so that the adhesive deposits 20, 21 can be reliably prevented from undergoing crack formation under thermal loads.

Figure 5:
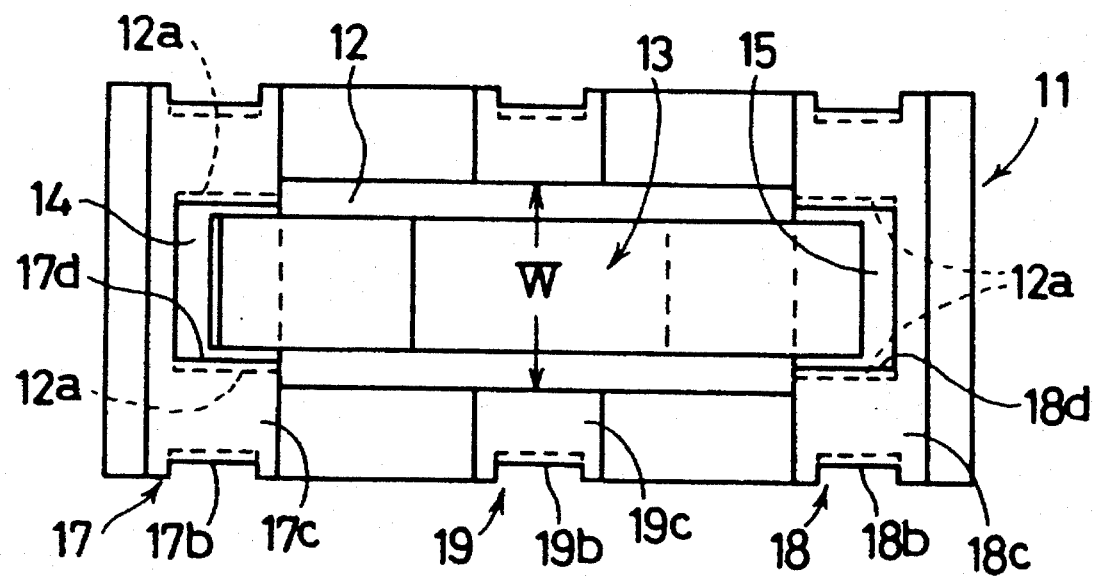
FIG. 5 is a plan view showing a package body of the same oscillator as seen in the direction of arrows V—V in FIG. 1.

Each end of the housing groove 12 of the package body 11 is integrally provided with a pair of end positioning walls 12a protruding toward each other for reducing the width at the relevant end of the housing groove 12 in comparison with the normal groove width W (see FIG. 5). The pair of end positioning walls 12a prevents the piezoelectric element 13 from translationally or angularly deviating sidewise within the housing groove 12. The internal side film portions 17d, 18d of each of the end lead electrodes 17, 18 are formed on the respective end positioning walls 12a.

The lid member 16 is a rectangular plate which is made of a dielectric substance such as barium titanate. The underside of the lid member 16 is formed with three film-like capacitor electrodes 16a, 16b, 16c (first to third capacitor electrodes) which are spaced from each other longitudinally of the lid member. Due to combinations of these capacitor electrodes, the lid member 16 is made to have two capacitors.

The lid member 16 is fixed on the package body 11 by means of a suitable bonding layer 22 to close the housing groove 12. The bonding layer 22 may comprise non-conductive portions at positions clear of the respective capacitor electrodes 16a, 16b, 16c, and conductive portions at positions corresponding to the capacitor electrodes 16a, 16b, 16c which are thereby held in electrical conduction with the lead electrodes 17, 18, 19, respectively, of the package body 11. The conductive portions of the bonding layer 22 may be made of a conductive adhesive or a solder paste, whereas the non-conductive portions may be made of a relatively soft resin such as thermoplastic resin. The use of the soft resin for the non-conductive portions of the bonding layer 22 is advantageous in that the soft resin absorbs or buffers a difference in thermal expansion between the package body 11 and the lid member 16, so that the bonding layer 22 is prevented from breaking under thermal loads.

Alternatively, the bonding layer 22 may be uniformly made of an anisotropic pressure sensitive conductive elastomer which is a composite material consisting of a silicone rubber matrix and metal particles dispersed in the matrix. Specifically, the metal particles in the rubber matrix are densely dispersed in a first direction but sparsely dispersed in a second direction perpendicular to the first direction. Thus, the anisotropic conductive elastomer becomes conductive when compressed in the first direction to a degree higher than a predetermined level, but remains non-conductive when compressed in the second direction.

In the illustrated embodiment, due to the thickness of the capacitor electrodes 16a, 16b, 16c and the lead electrodeds 17, 18, 19, the bonding layer 22 made uniformly of anisotropic pressure sensitive conductive elastomer is compressed to a higher degree at the respective capacitor electrodes 16a, 16b, 16c than at other positions when the lid member 16 is attached to the package body 11. Therefore, the bonding layer 22 becomes conductive selectively only at the capacitor electrodes 16a, 16b, 16c. Apparently, the use of the anisotropic pressure sensitive conductive elastomer is advantageous for facilitating the step of attaching the lid member 16 to the package body 11.

The top surface of the lid member 16 is entirely covered by an electrically insulating layer 23. This insulating layer may be formed by applying an insulating paste by a thick film printing method, and thereafter drying the paste for setting. The insulating layer 23 may be also formed by spraying an insulating paint, and thereafter drying the paint for curing.

Alternatively, the insulating layer 23 may be formed by depositing a metal oxide (e.g. $Al_2O_3$, $BiO_2$, or MgO) by a vacuum deposition method. Preferably, the insulating layer 23 has nearly the same coefficient of thermal expansion as the lid member 16 because otherwise the lid member 16 combined with the insulating layer 23 may longitudinally bend under thermal loads due to the so-called bimetal phenomenon.

When the piezoelectric oscillator is mounted on a printed circuit board 24 (see FIG. 1), an external conductive component (not shown) on the same circuit board 24 may come in contact with or close proximity to the lid member 16 of the oscillator. In such a case, however, the insulating layer 23 prevents the lid member 16 from being electrostatically influenced by the external component. As a result, the oscillation frequency of the piezoelectric oscillator is prevented from fluctuating.

Figure 6:
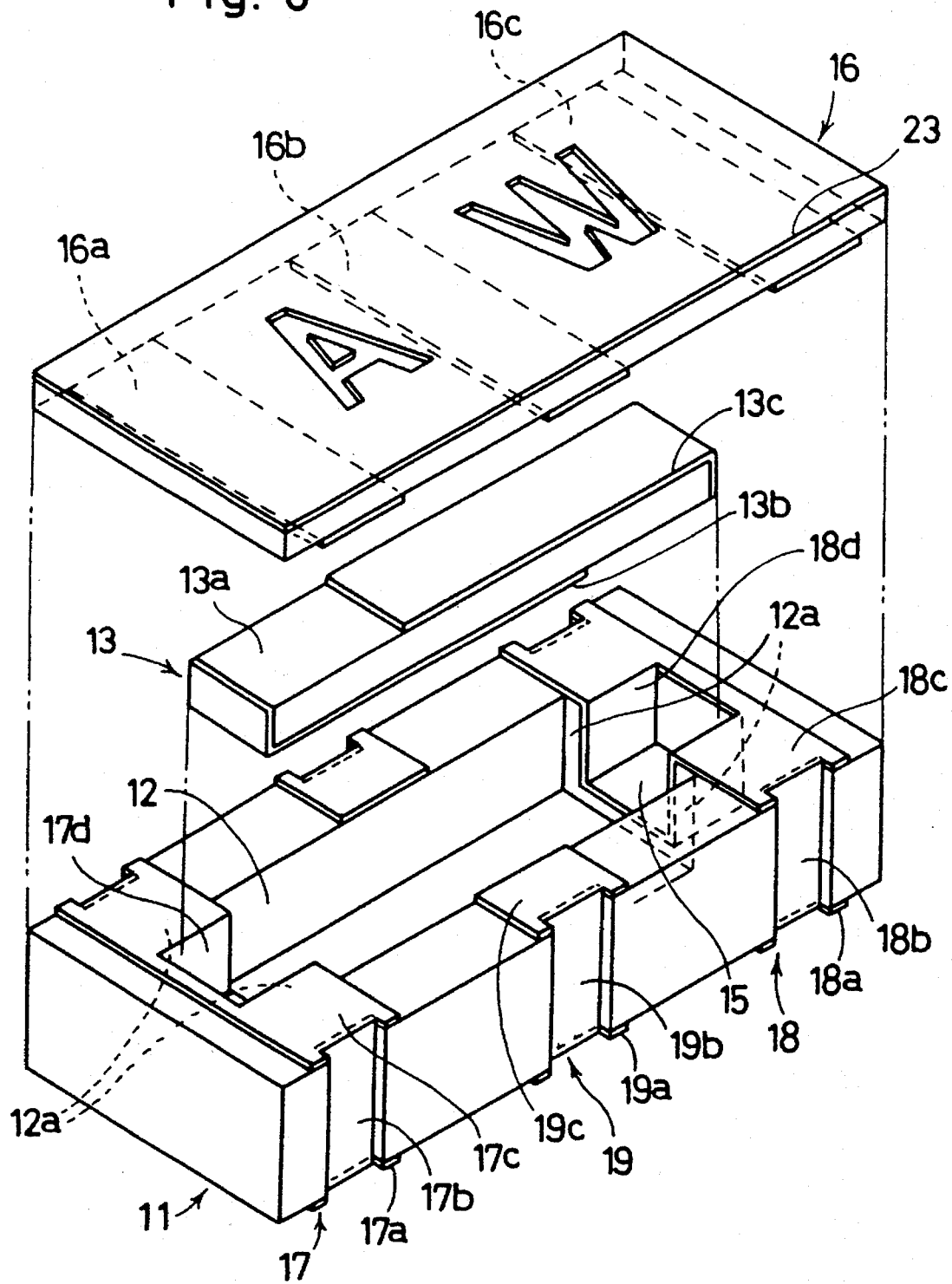
FIG. 6 is a perspective view showing the same oscillator in an exploded state.

As shown in FIG. 6, the insulating layer 23 may be preferably formed with indication cutouts 23a, 23b at positions between the respective capacitor electrodes 16a, 16b, 16c. In this case, the color of the insulating layer 23 should advantageously be different from that of the lid member 16 for highlighting the indication cutouts 23a, 23b.

Figure 7:
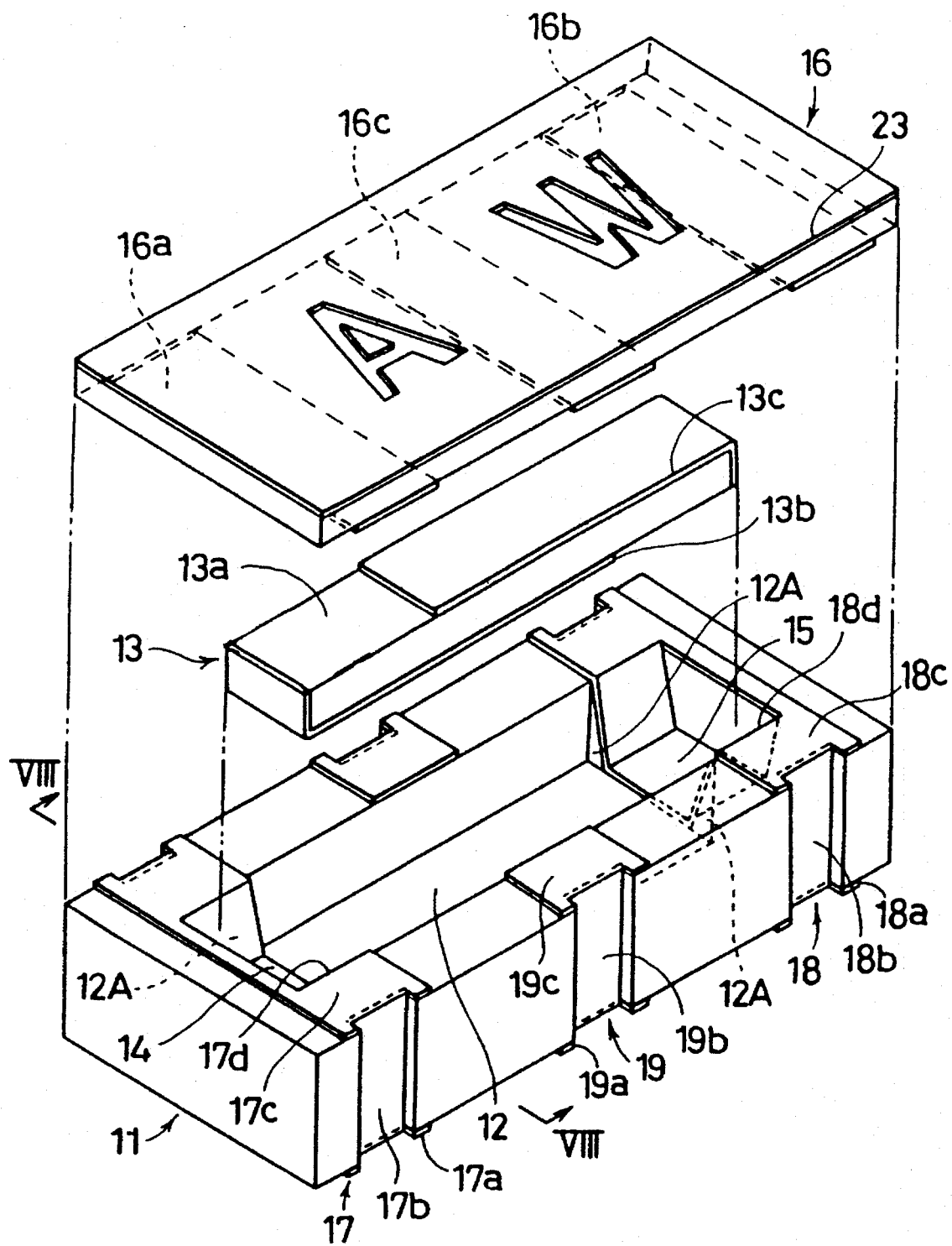
FIG. 7 is an exploded perspective similar to FIG. 6 but showing a packaged piezoelectric oscillator according to a second embodiment of the present invention.
Figure 8:
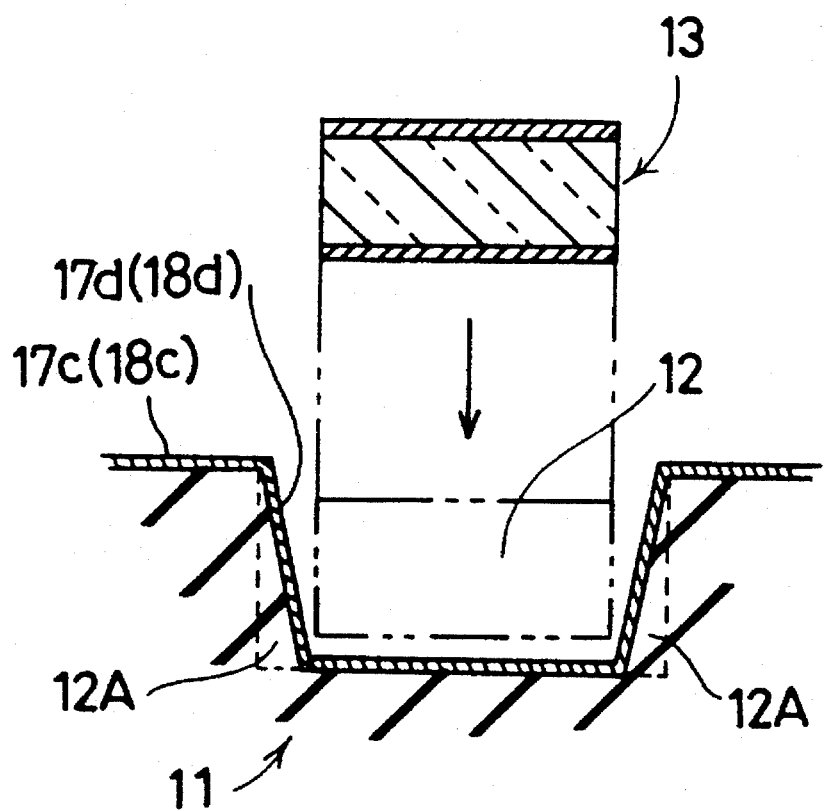
FIG. 8 is a sectional view taken along on lines VIII—VIII in FIG. 7.

FIGS. 7 and 8 show a packaged piezoelectric oscillator according to a second embodiment of the present invention. The oscillator of the second embodiment is similar to that of the first embodiment but differs therefrom only in that each end of the housing groove 12 of the package body 11 is integrally provided with a pair of end positioning walls 12A which are inclined downwardly toward each other. Apparently, the pair of inclined end positioning walls 12A facilitates insertion of the piezoelectric element 13 into the housing groove 12 while also providing automatic longitudinal alignment of the element 13 relative to the groove 12.

The packaged piezoelectric oscillator according to either one of the foregoing embodiments may be manufactured substantially by a similar method. Now, such a manufacturing method is specifically described with reference to FIGS. 9 through 21 of the accompanying drawings.

Figure 9:
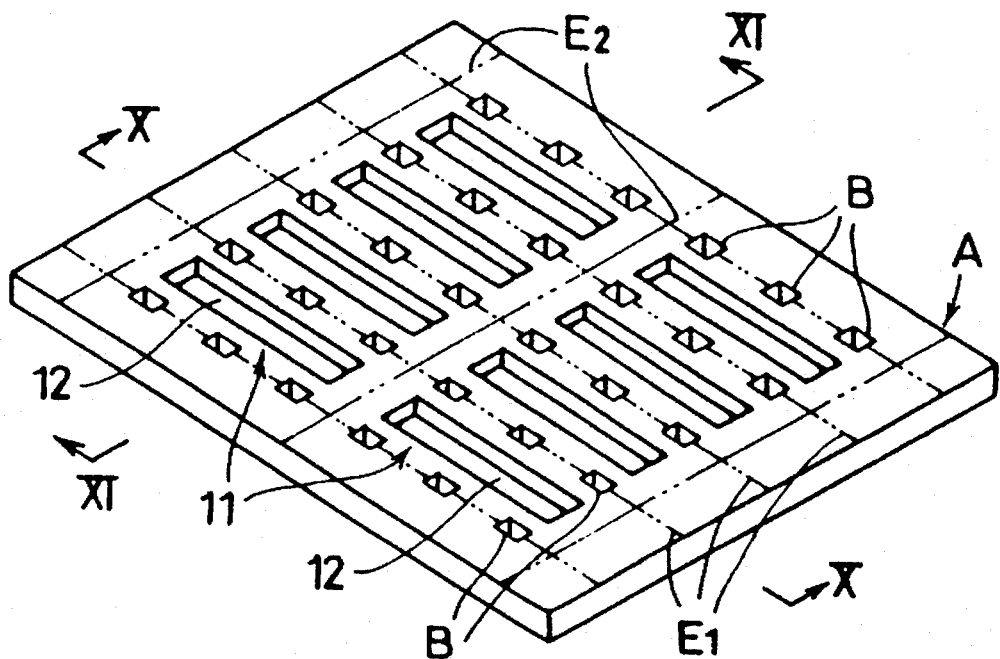
FIG. 9 is a perspective view showing a master package plate which is used for making a plurality of packaged piezoelectric oscillators at a time.
Figure 10:
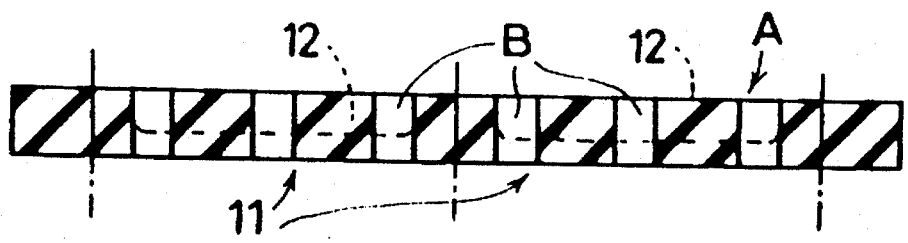
FIG. 10 is a sectional view taken on lines X—X in FIG. 9.
Figure 11:
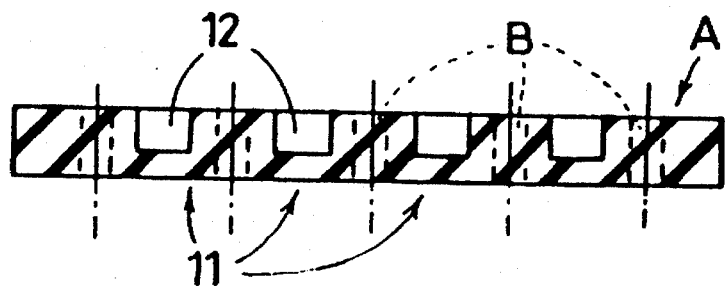
FIG. 11 is a sectional view taken on lines XI—XI in FIG. 9.

First, as shown in FIGS. 9 through 11, a master package plate A made of a synthetic resin (insulating material) is prepared to have a plurality of housing grooves 12 in plural rows. Therefore, the master package plate A can provide a plurality of unit package bodies 11 when subsequently divided along longitudinal and transverse cutting lines E1, E2. Further, the master package plate A is also formed with a plurality of through-holes B suitably spaced along the respective longitudinal cutting lines E1 and arranged in transverse rows parallel to the transverse cutting lines E2. It should be appreciated that each end of each housing groove 12 is actually formed with a pair of end positioning portions 12a (see FIG. 6), but they are omitted in FIGS. 9–11 only for simplicity of illustration.

Figure 12:
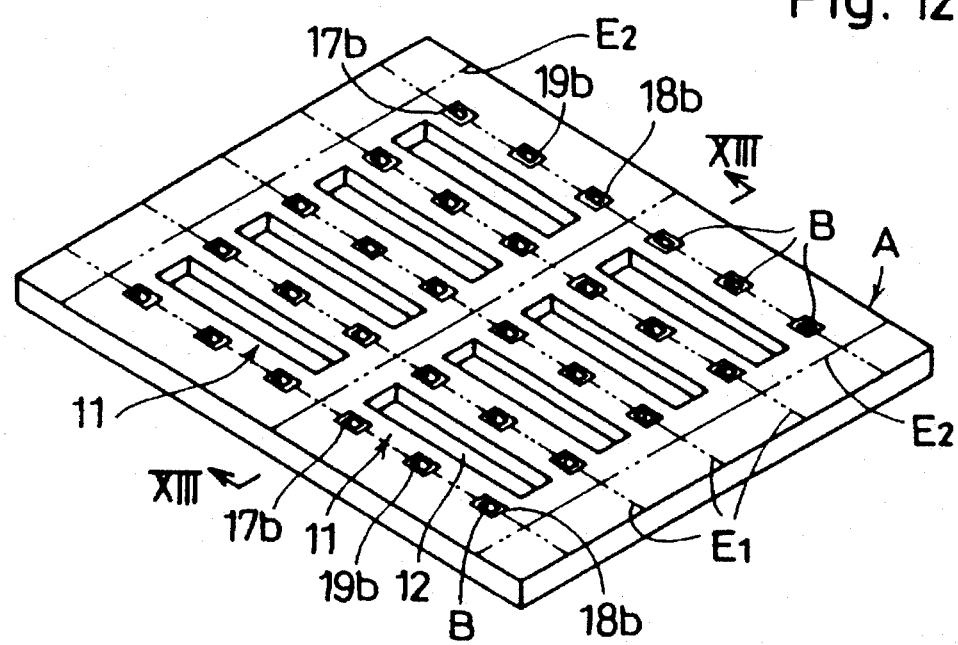
FIG. 12 is a perspective view similar to FIG. 9 but showing the same master package plate after forming conductor coatings at respective through-holes.
Figure 13:
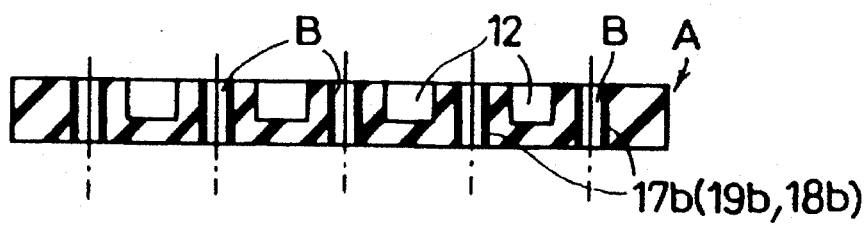
FIG. 13 is a sectional view taken along lines XIII—XIII in FIG. 12.

Then, as shown in FIGS. 12 and 13, conductor coatings 17b, 18b, 19b are formed in the respective through-holes B by loading a metal paste (e.g. siliver paste) therein for example. Apparently, these conductor coatings later provide the external side film portions 17b, 18b, 19b of the respective lead electrodes 17, 18, 19 (see FIG. 6).

Figure 14:
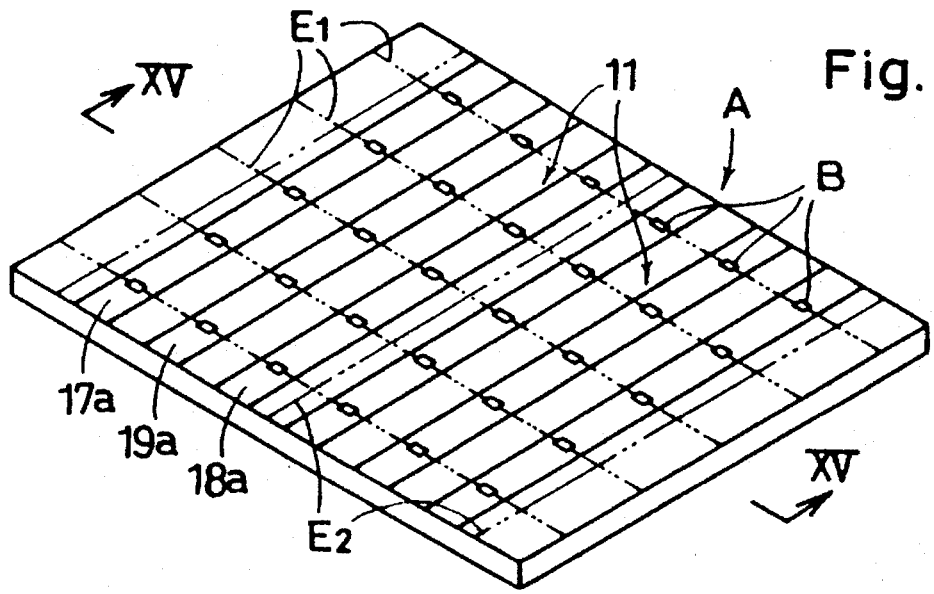
FIG. 14 is a perspective view showing the master package plate of FIG. 9 after forming conductor strips on the tail surface of the master package plate.
Figure 15:
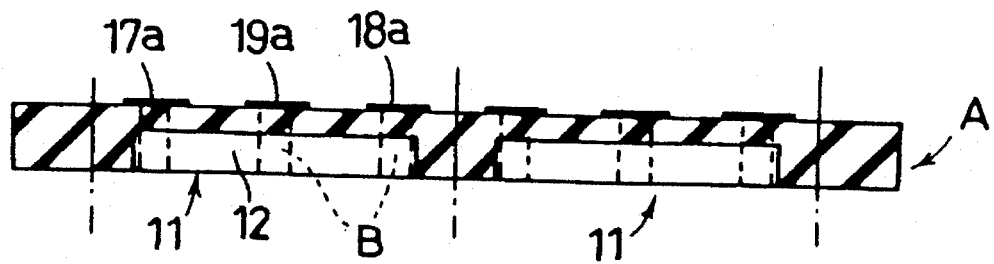
FIG. 15 is a sectional view taken along lines XV—XV in FIG. 14.

Then, as shown in FIGS. 14 and 15, conductor strips 18a, 19a are formed on the tail surface of the master package plate A by applying a metal paste (e.g. siliver paste) in parallel to the transverse cutting lines E2 along the respective transverse rows of through-holes B. Apparently, these conductor strips later provide the external bottom film portions 17a, 18a, 19a of the respective lead electrodes 17, 18, 19 (see FIGS. 1–3).

Figure 16:
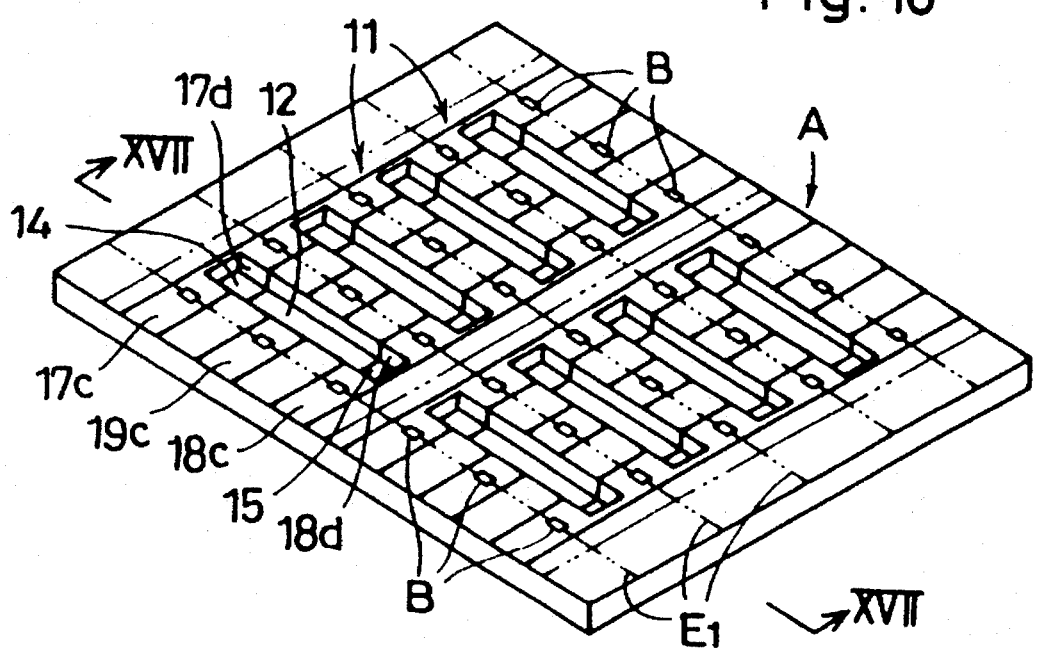
FIG. 16 is a perspective view showing the master package plate of FIG. 9 after forming conductor strips on the head surface of the master package plate.
Figure 17:
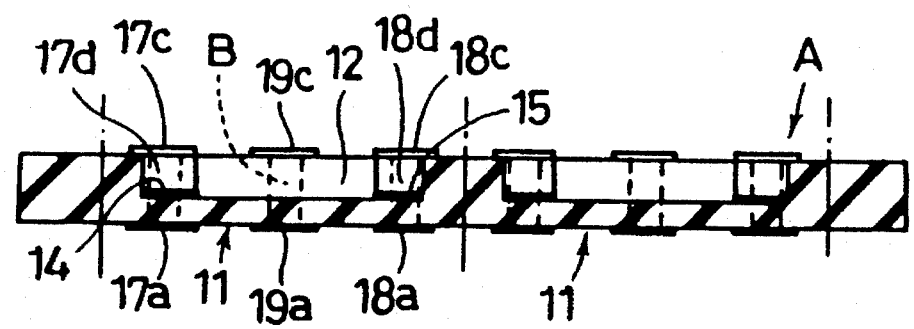
FIG. 17 is a sectional view taken along lines XVII—XVII in FIG. 16.

Then, as shown in FIGS. 16 and 17, conductor coatings 17c, 18c, 19c are formed on the head surface of the master package plate A at the respective through-holes B by applying a metal paste (e.g. siliver paste) in parallel to the transverse cutting lines E2 along the respective transverse rows of through-holes B. Apparently, these conductor strips later provide the external top film portions 17c, 18c, 19c of the respective lead electrodes 17, 18, 19 (see FIG. 6).

As also shown in FIGS. 16 and 17, conductor coatings 14, 15, 17d, 18d are also formed in the respective housing grooves 12 by applying a metal paste (e.g. silver paste). Apparently, these conductor coatings correspond to the internal side film portions 17d, 18d of the respective end lead electrodes 17, 18 and the oscillator electrodes 14, 15. It should be appreciated that the formation of the internal side film portions 17d, 18d and oscillator electrodes 14, 15 may be performed either simultaneously with or separately from the formation of the external top film portions 17c, 18c, 19c.

The process steps shown in FIGS. 12 through 17 for forming the lead electrodes 17, 18, 19 and the oscillator electrodes 15 may be performed in any sequence, and selected ones of these process steps may be performed simultaneously. For instance, the formation of the bottom film portions 17a, 18a, 19a of the respective lead electrodes 17, 18, 19 may be performed before forming the external side film portions 17b, 18b, 19b.

As an alternative to applying a metal paste (e.g. silver paste), the lead electrodes 17, 18, 19 and the oscillator electrodes 12, 15 may be formed by a combination of metal plating and subsequent patterning. Specifically, the master package plate A as a whole is first coated with a metal by electroless plating or electrolytic plating, and the metal coating or plating is then patterned by photoetching or laser trimming into the lead electrodes 17, 18, 19 and the oscillator electrodes 14, 15. For this purpose, the master package plate A need be entirely made of a metal-platable resin. The term "metal-platable resin" is used herein to mean that the resin can be plated with a metal. Such a resin may be prepared by mixing a suitable amount of metal catalyst such as palladium or gold in a resin matrix consisting of liquid crystal polymer (LCP), polyether sulfone (PES) or polyphenylene sulfide (PES).

Figure 18:
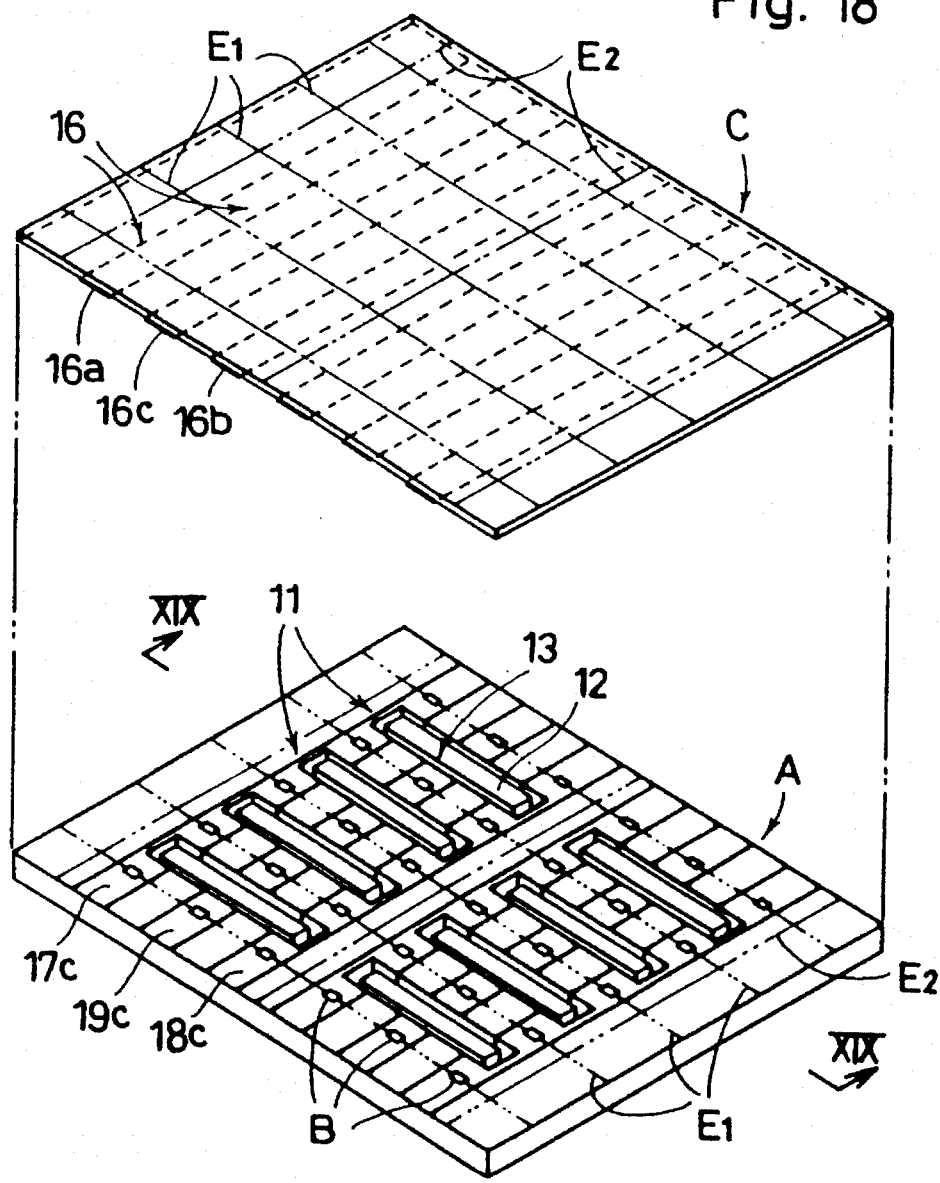
FIG. 18 is an exploded perspective view showing the master package plate of FIG. 9 together with loaded piezoelectric elements and a master lid plate.
Figure 19:
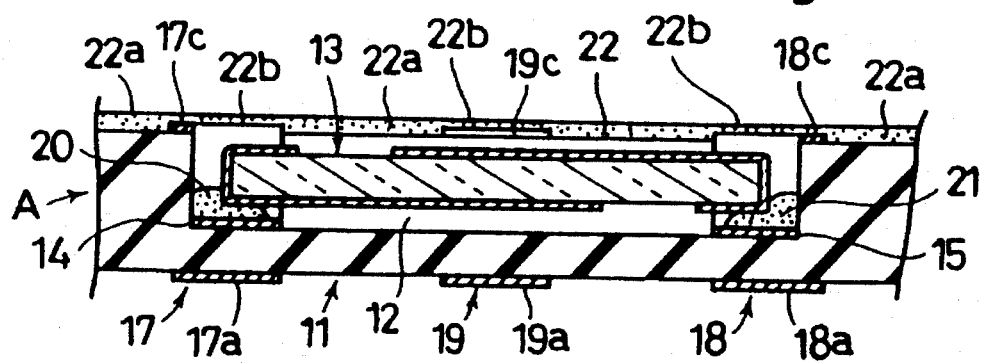
FIG. 19 is a sectional view taken along lines XIX—XIX in FIG. 18.

Then, as shown in FIGS. 18 and 19, a plurality of piezoelectric elements 13 are placed in the respective housing grooves 12 and fixed therein by deposits 20, 21 of an electrically conductive adhesive. As previously described, each element 13 is held in electrical connection with the respective oscillator electrodes 14, 15 through the conductive adhesive deposits 20, 21.

Then, as also shown in FIG. 18, a master lid plate C made of a dielectric substance is prepared which provides a plurality of unit lid members 16 when subsequently divided along the longitudinal and transverse cutting lines E1, E2. The underside of the master lid plate C is formed with a plurality of electrodes strips 16a, 16b, 16c extending in parallel to the transverse cutting lines E2 in corresponding relation to the transverse rows of the through-holes B of the master package plate A. The electrode strips 16a, 16b, 16c may be made by printing a metal paste or by vacuum deposition of a metal. Apparently, these electrodes strips correspond to the capacitor electrodes 16a, 16b, 16c of the respective unit lid members 16.

For attaching the master lid plate C to the master package plate A, a bonding layer 22 is formed on the top surface of the master package plate A, as shown in FIG. 19. As previously described, the bonding layer 22 comprises non-conductive portions 22a at positions clear of the respective lead electrodes 17, 18, 19 of the master package plate A, and conductive portions 22b at positions corresponding to the lead electrodes 17, 18, 19. The conductive portions 22b of the bonding layer 22 may be made of a conductive adhesive or a solder paste, whereas the non-conductive portions may be made of a thermoplastic resin. The master lid plate C is pressed against the bonding layer 22 which is cured by heating.

As also described previously, the entirety of the bonding layer 22 may be alternatively made of an anisotropic pressure sensitive conductive elastomer. In this case, the bonding layer 22, which is initially non-conductive as a whole, becomes conductive only at the portions 22b where a higher compression is applied due to the presence of the electrodes 16a, 16b, 16c, 17, 18, 19 when the master lid plate C is pressed against the master package plate A. Apparently, the use of the anisotropic pressure sensitive conductive elastomer is advantageous for facilitating the step of attaching the master lid plate C to the master package plate A.

Figure 20:
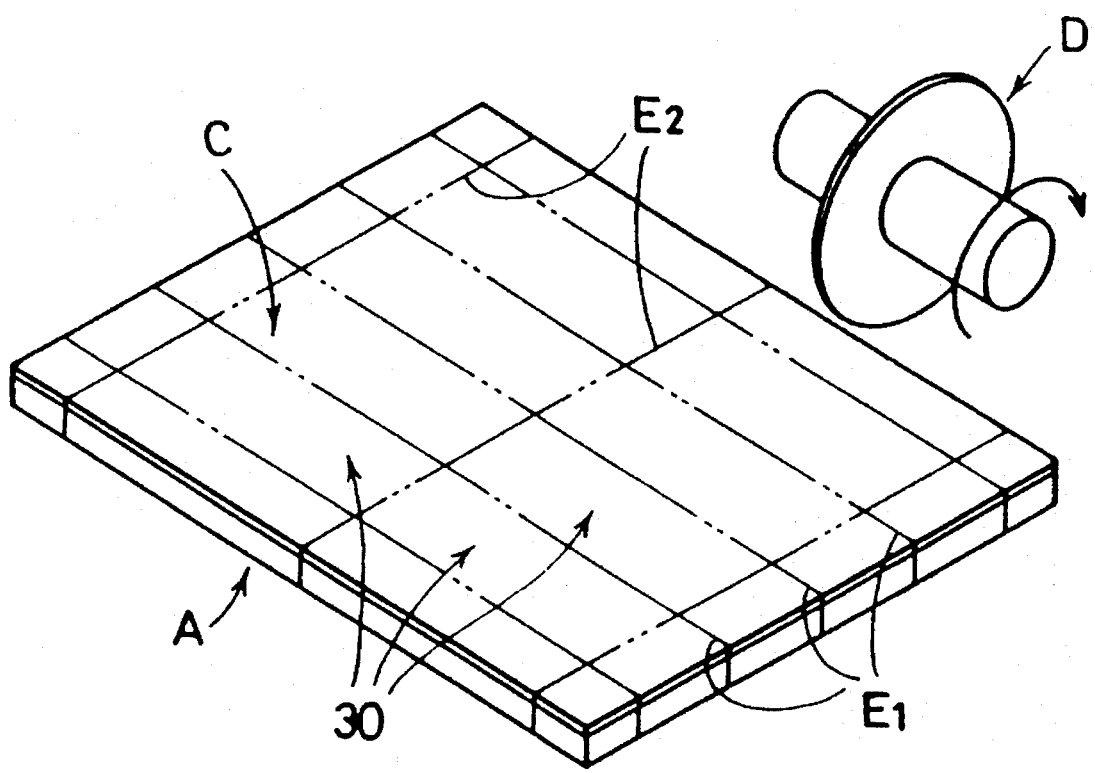
FIG. 20 is a perspective view showing the assembly of the master package plate and the master lid plate at the time of cutting into a plurality of packaged piezoelectric oscillators.
Figure 21:
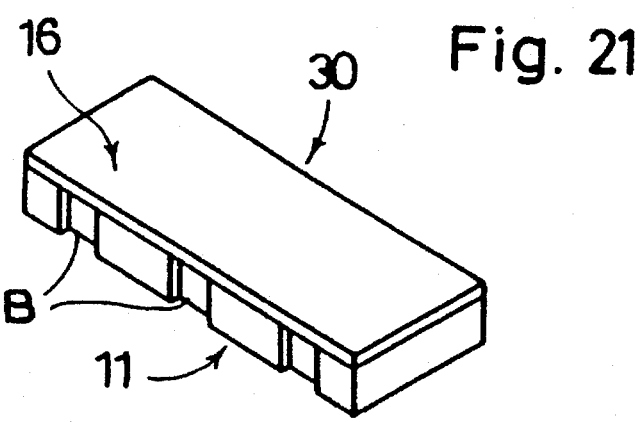
FIG. 21 is a perspective view showing one of the oscillators obtained as a result of cutting.
Figure 22:
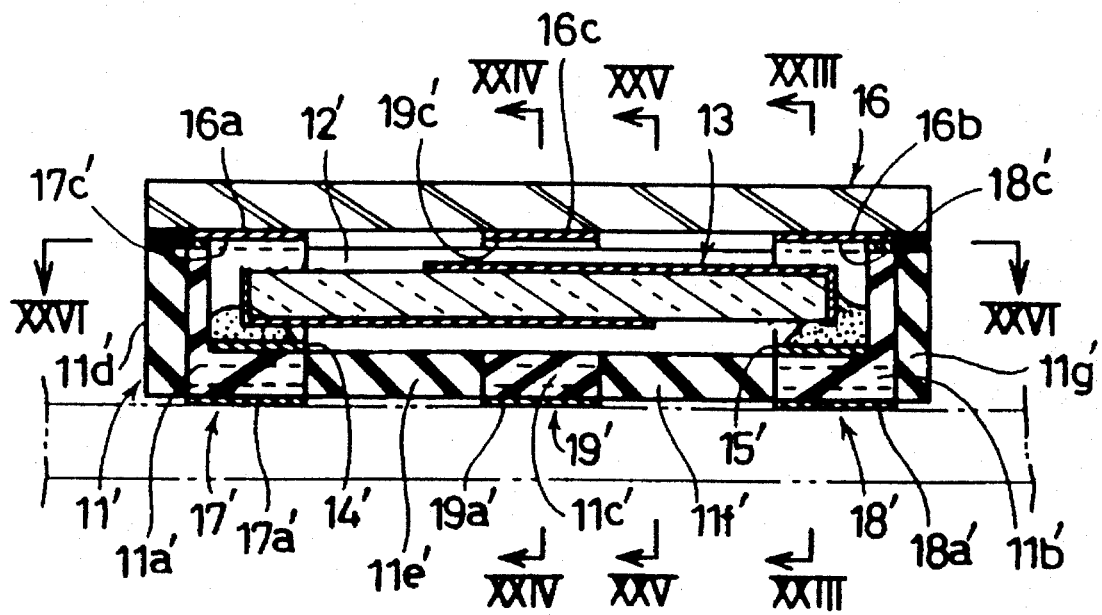
FIG. 22 is a view, in longitudinal section, showing a packaged piezoelectric oscillator according to a third embodiment of the present invention.
Figure 23:
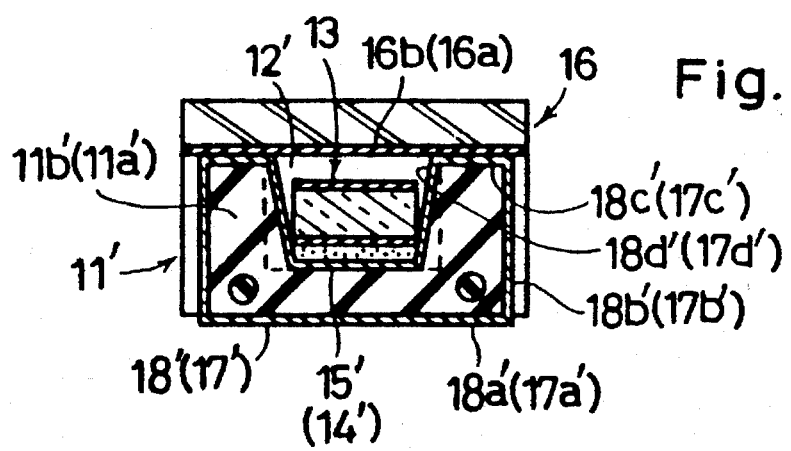
FIG. 23 is a sectional view taken along lines XXIII—XXIII in FIG. 22.
Figure 24:
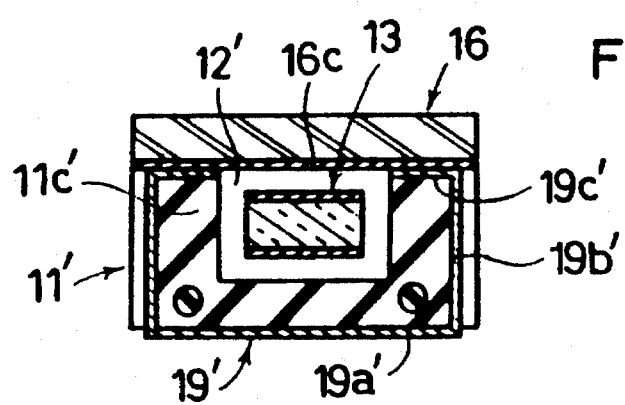
FIG. 24 is a sectional view taken along lines XXIV—XXIV in FIG. 22.
Figure 25:
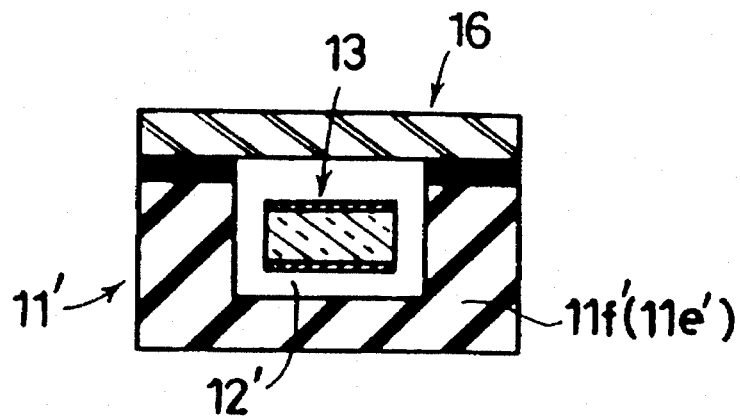
FIG. 25 is a sectional view taken along lines XXV—XXV in FIG. 22.
Figure 26:
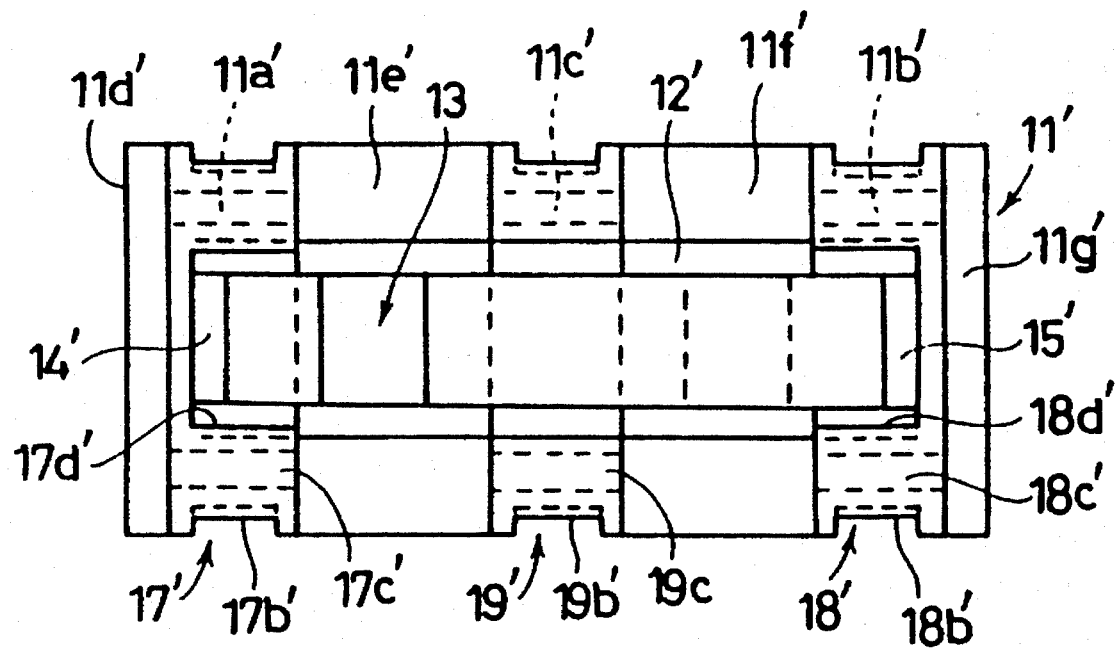
FIG. 26 is a plan view showing a package body of the same oscillator as seen in the direction of arrows XXVI—XXVI in FIG. 22.

Finally, as shown in FIG. 20, the assembly of the master package plate A and the master lid plate C is cut by a high-speed rotary cutter D along the longitudinal and transverse cutting lines E1, E2 to provide a plurality of packaged piezoelectric oscillators 30. FIG. 21 shows one of the thus obtained oscillators 30.

FIGS. 22 through 26 show a packaged piezoelectric oscillator according to a third embodiment of the present invention. The oscillator of this embodiment mainly comprises a package body 11', a piezoelectric element 13, and a lid member 16. As can be readily appreciated, the piezoelectric element 13 and lid member 16 of the third embodiment are substantially the same as those of the first embodiment, so that the details of these elements are not described.

The package body 11' is a rectangular block having an upwardly open housing groove 12'. The bottom surface of the groove 12' is formed with film-like oscillator electrodes 14', 15' respectively at both ends of the groove 12'.

The package body 11' is further formed with three film-like lead electrodes which are spaced from each other longitudinally of the package body 11' and include a pair of end lead electrodes 17', 18' and an intermediate lead electrode 19'. Each of the end lead electrodes 17', 18' is electrically connected to a corresponding one of the oscillator electrodes 14', 15' at the bottom of the package body 11', and comprises an external bottom film portion 17a', 18a', a pair of external side film portions 17b', 18b', a pair of external top film portions 17c', 18c', and a pair of internal side film portions 17d', 18d'. The intermediate lead electrode 19' comprises an external bottom film portion 19a', a pair of external side film portions 19b', and a pair of external top film portions 19c'.

According to the third embodiment, the package body 11' consists of a plurality of electrode forming portions 11a', 11b', 11c' corresponding to the respective lead electrodes 17', 18', 19', and a plurality of non-electrode forming portions 11d', 11e', 11f', 11g' alternate with the electrode forming portions 11a', 11b', 11c'. The electrode forming portions 11a', 11b', 11c' are made of a platable resin which may be prepared by mixing a suitable amount of metal catalyst such as palladium or gold in a resin matrix consisting of liquid crystal polymer (LCP), polyether sulfone (PES) or polyphenylene sulfide (PES). On the other hand, the non-electrode forming portions 11d', 11e', 11f', 11g' may be made of a non-platable resin (e.g. LCP, PES or PES not containing metal catalyst). As a result, the respective lead electrodes 17', 18', 19' can be formed selectively only at the electrode forming portions 11a', 11b', 11c' even if the package body 11' as a whole is subjected to electroless or electrolytic plating.

The package body 11' having the above-described structure may be made by two different methods, as described below.

Figure 27:
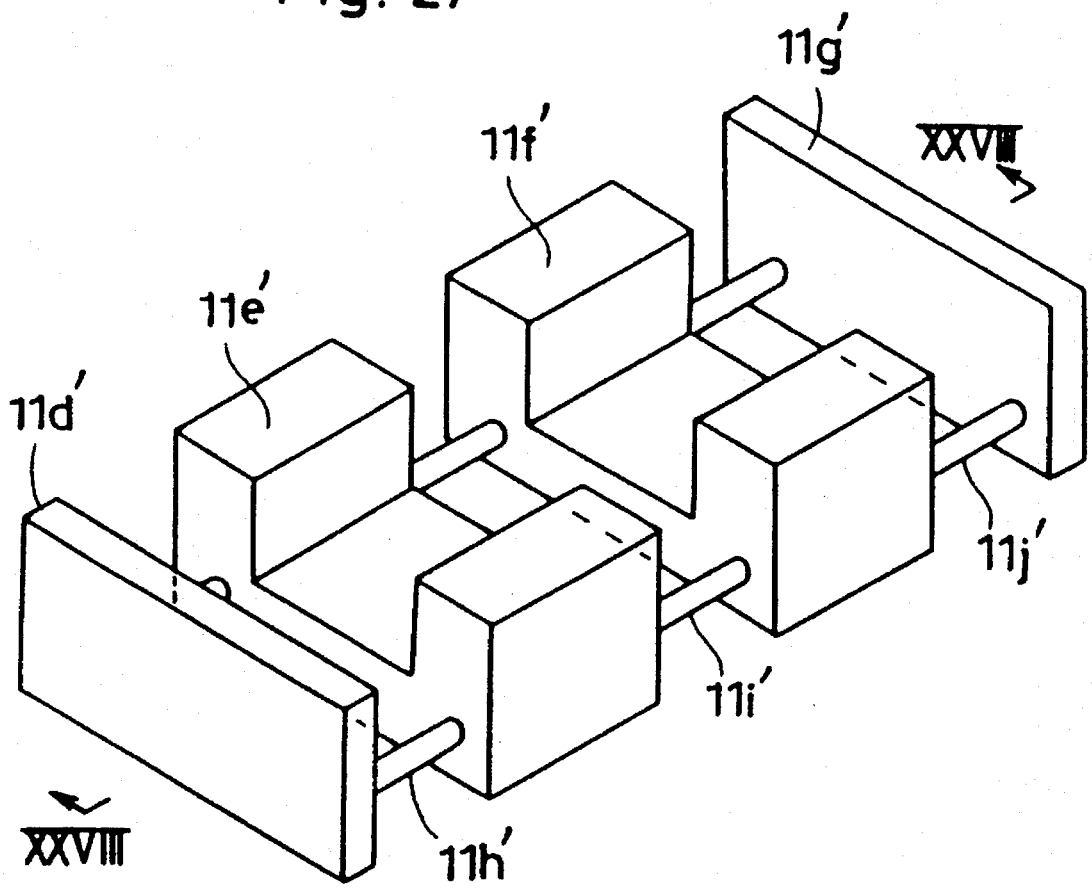
FIG. 27 is a perspective view showing an intermediate package frame obtained by primary molding and used for making a complete package body to be incorporated in the oscillator of the fourth embodiment.
Figure 28:
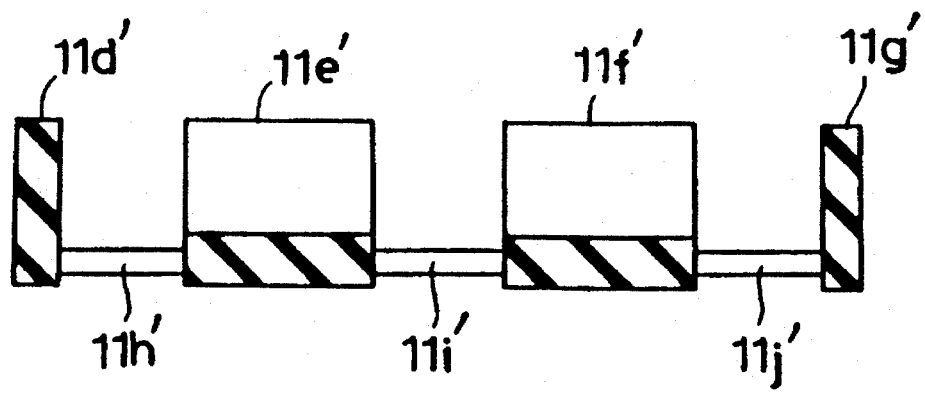
FIG. 28 is a sectional view taken along lines XXVIII—XXVIII in FIG. 27.
Figure 29:
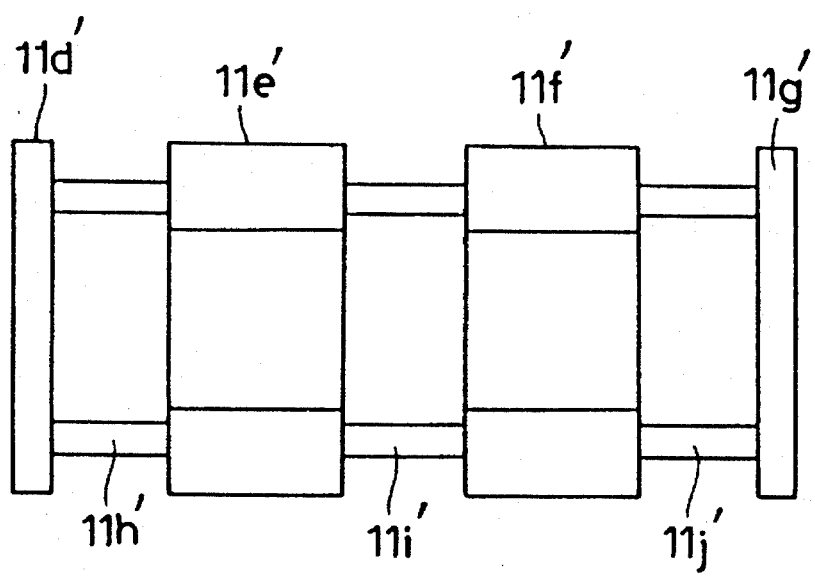
FIG. 29 is a plan view showing the intermediate package frame of FIG. 27.
Figure 30:
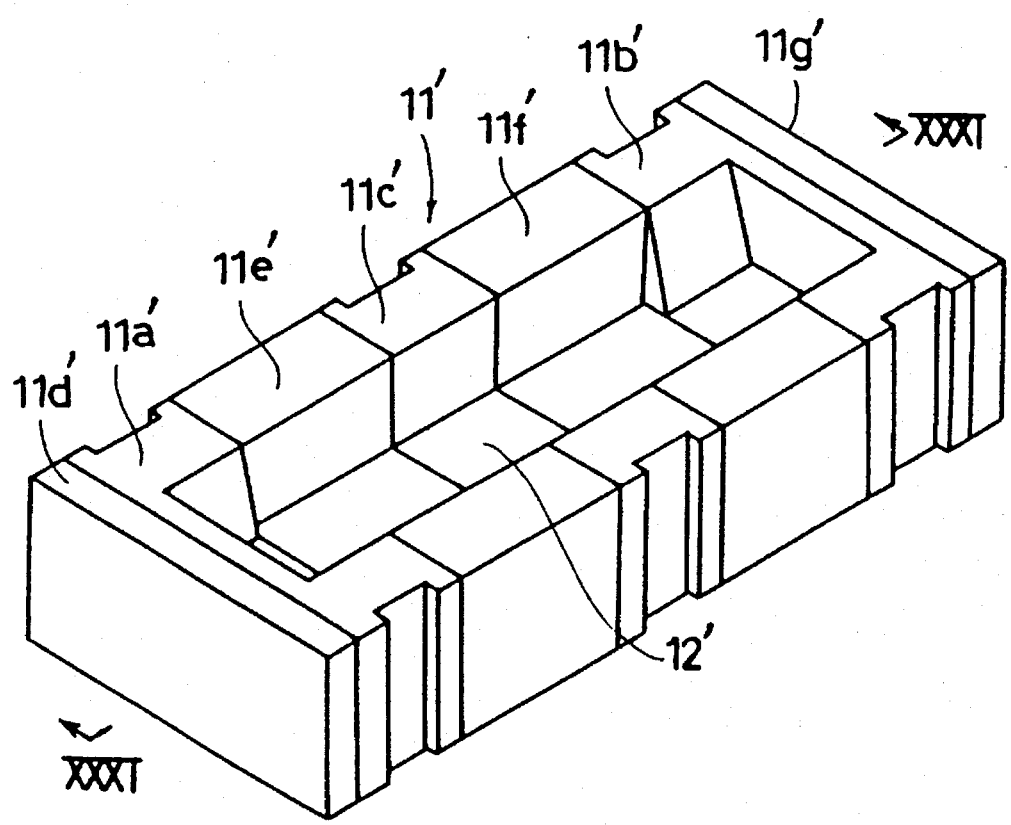
FIG. 30 is a perspective view showing the complete package body obtained by secondary molding.
Figure 31:
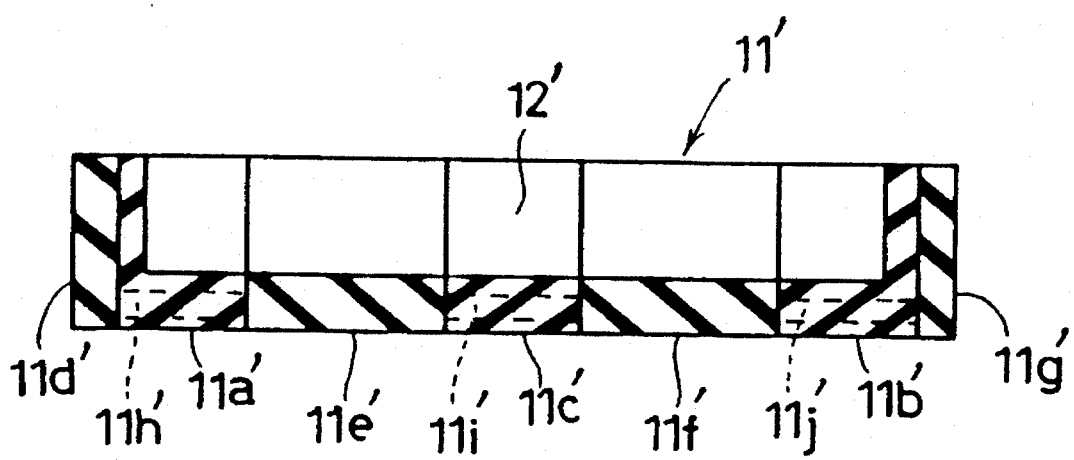
FIG. 31 is a sectional view taken along lines XXX—XXX in FIG. 30.
Figure 32:
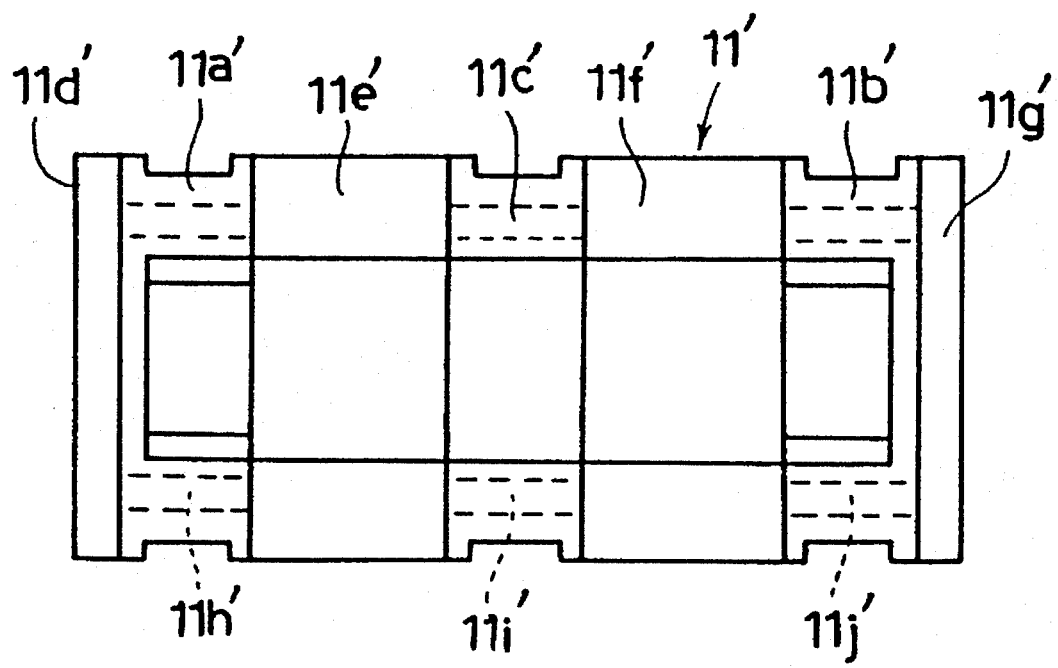
FIG. 32 is a plan view showing the complete package body of FIG. 30.

A first method is shown in FIGS. 27–32. According to this method the plurality of non-electrode forming portions 11d', 11e', 11f', 11g', which are connected together by a plurality of connector rod portions 11h', 11i', 11j', are first formed of a non-platable resin by primary molding (FIGS. 27–29). Then, the plurality of electrode forming portions 11a', 11b', 11c', are formed of a platable resin by secondary molding to be alternate with the non-electrode forming portions 11d', 11e', 11f', 11g' (FIGS. 30–32).

Figure 33:
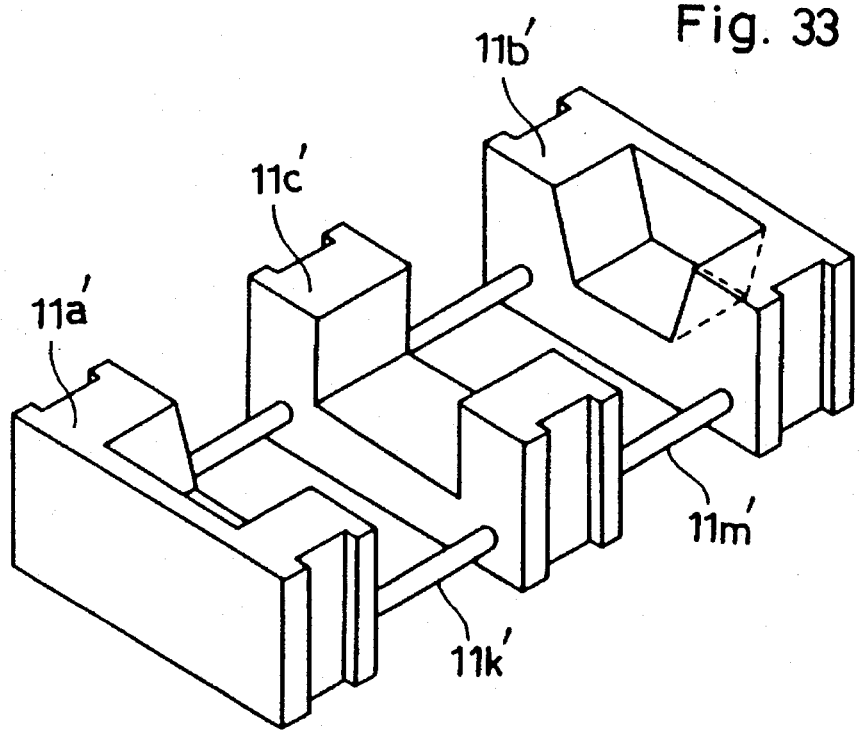
FIG. 33 is a perspective view showing another intermediate package frame obtained by primary molding and used for making another complete package body to be incorporated in the oscillator of the fourth embodiment.
Figure 34:
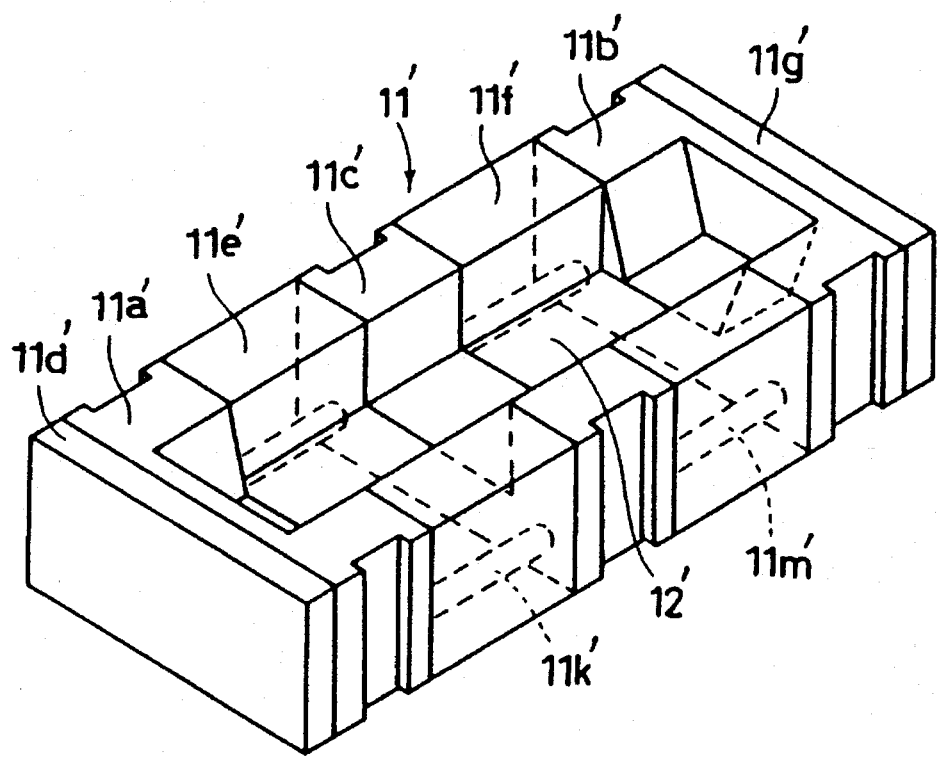
FIG. 34 is a perspective view showing the complete package body obtained by secondary molding.

A second method is shown in FIGS. 33 and 34. According to this method, the plurality of electrode forming portions 11a', 11b', 11c', which are connected together by a plurality of connector rod portions 11k', 11m', are first formed of a platable resin by primary molding (FIGS. 33). Then, the plurality of non-electrode forming portions 11d', 11e', 11f', 11g' are formed of a non-platable resin by secondary molding to be alternate with the electrode forming portions 11a', 11b', 11c' (FIG. 34).

Apparently, the provision of the electrode forming portions 11a', 11b', 11c together with the non-electrode forming portions 11d', 11e', 11f', 11g' facilitates formation of the respective lead electrodes 17', 18', 19' and the oscillator electrodes 14', 15.

Figure 35:
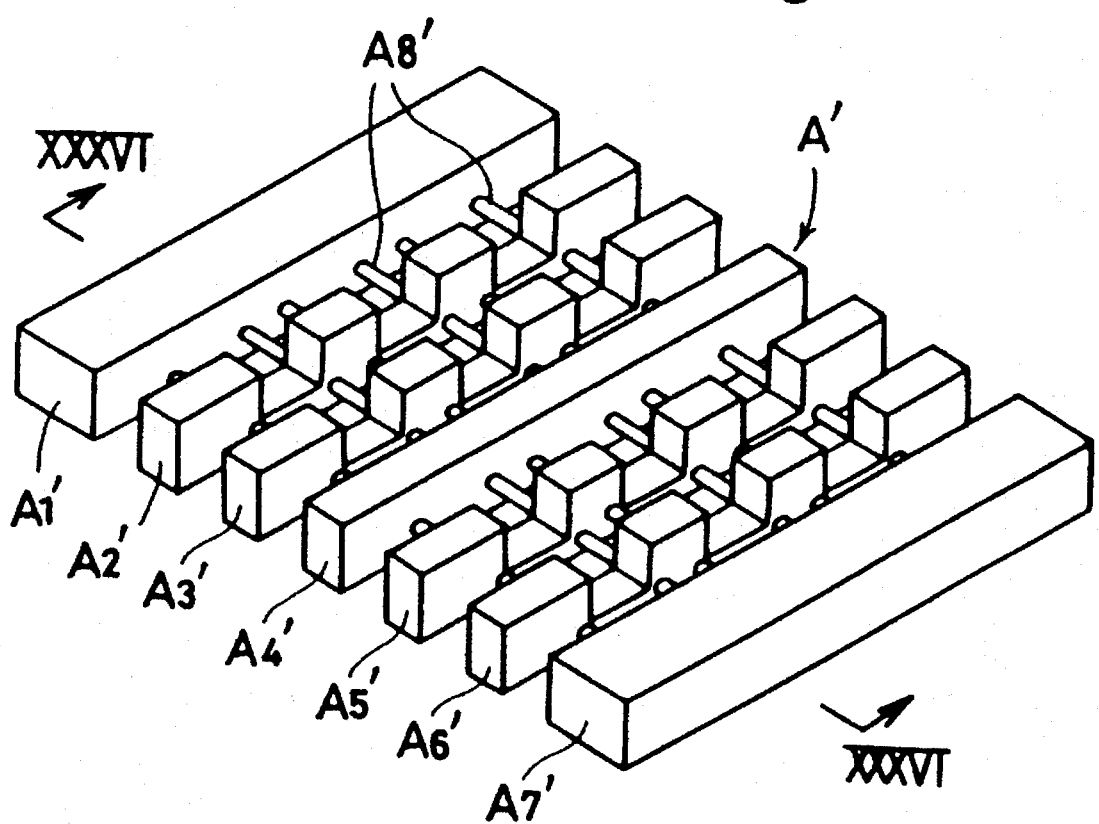
FIG. 35 is a perspective view showing an intermediate master package frame obtained by primary molding and used for making a plurality of complete package bodies.
Figure 36:
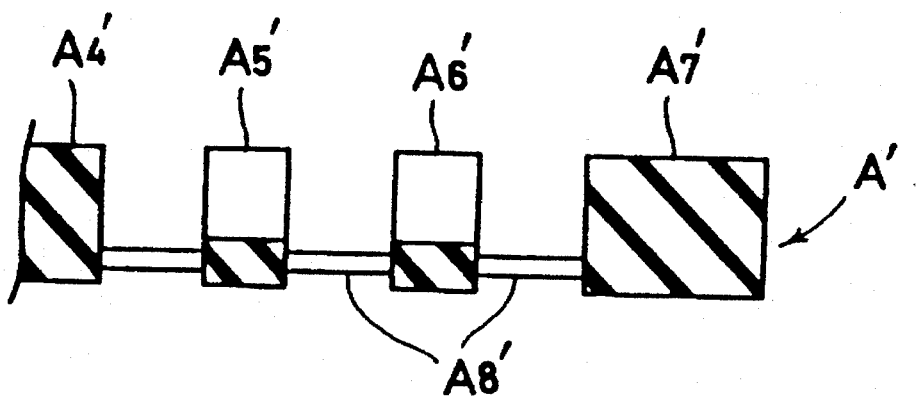
FIG. 36 is a sectional view taken along lines XXXVI—XXXVI in FIG. 35.
Figure 37:
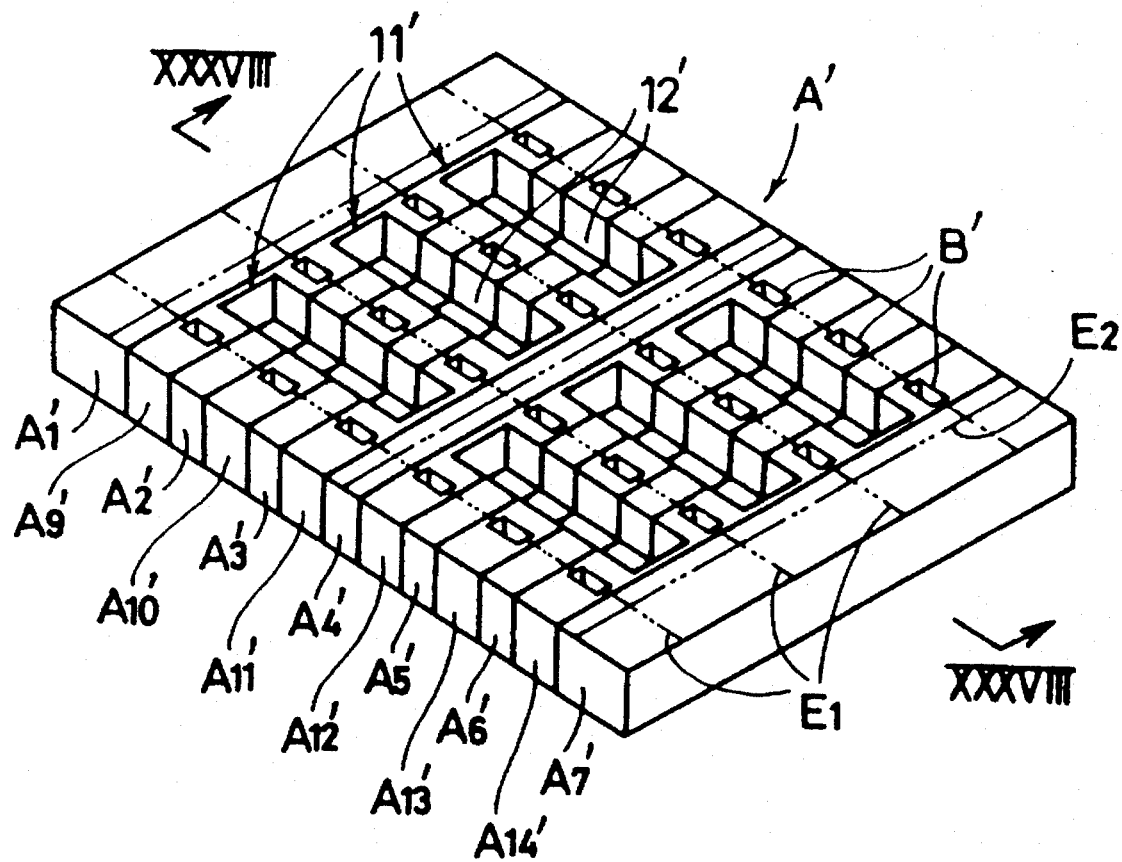
FIG. 37 is a perspective view showing a complete master package plate obtained by secondary molding.
Figure 38:
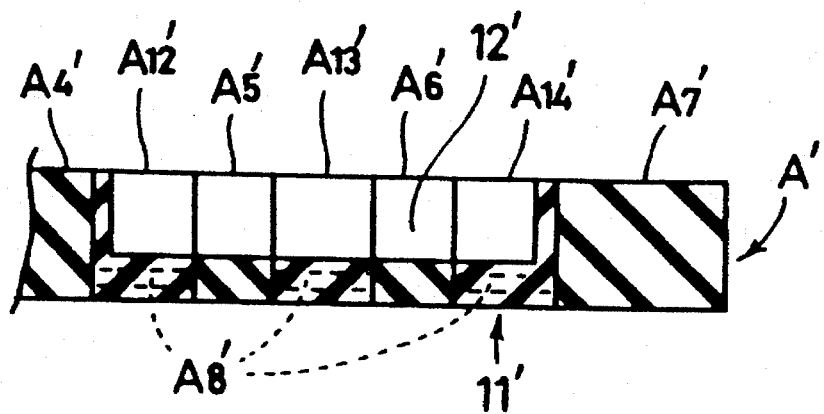
FIG. 38 is a sectional view taken along lines XXXVIII—XXXVIII in FIG. 37.

For quantity production, a plurality of non-electrode forming bars A1'–A7', which are connected together by a plurality of connector rod portions A8', are first formed of a non-platable resin by a primary molding, as shown in FIGS. 35 and 36. The primary molding is followed by secondary molding for forming a plurality of electrode forming bars A9'–A14' by injecting a platable resin, as shown in FIGS. 37 and 38.

As a result of the primary and second molding operations described above, a master package plate A' is prepared which has a plurality of housing grooves 12' in plural rows. The master package plate A' can provide a plurality of unit package bodies 11' when subsequently divided along longitudinal and transverse cutting lines E1, E2. Further, the master package plate A' is also formed with a plurality of through-holes B' suitably spaced along the respective longitudinal cutting lines E1 and arranged in transverse rows parallel to the transverse cutting lines E2.

Then, the master package plate A' as a whole is subjected to electroless or electrolytic plating for forming lead electrodes 17', 18', 19' and oscillator electrodes 14', 15' (see FIGS. 22–26) only at the electrode forming bars A9'–A14' which carry the through-holes B'. A plurality of packaged piezoelectric oscillators are produced by performing the subsequent process steps which are similar to those (FIGS. 18–21) for the first embodiment.

Figure 39:
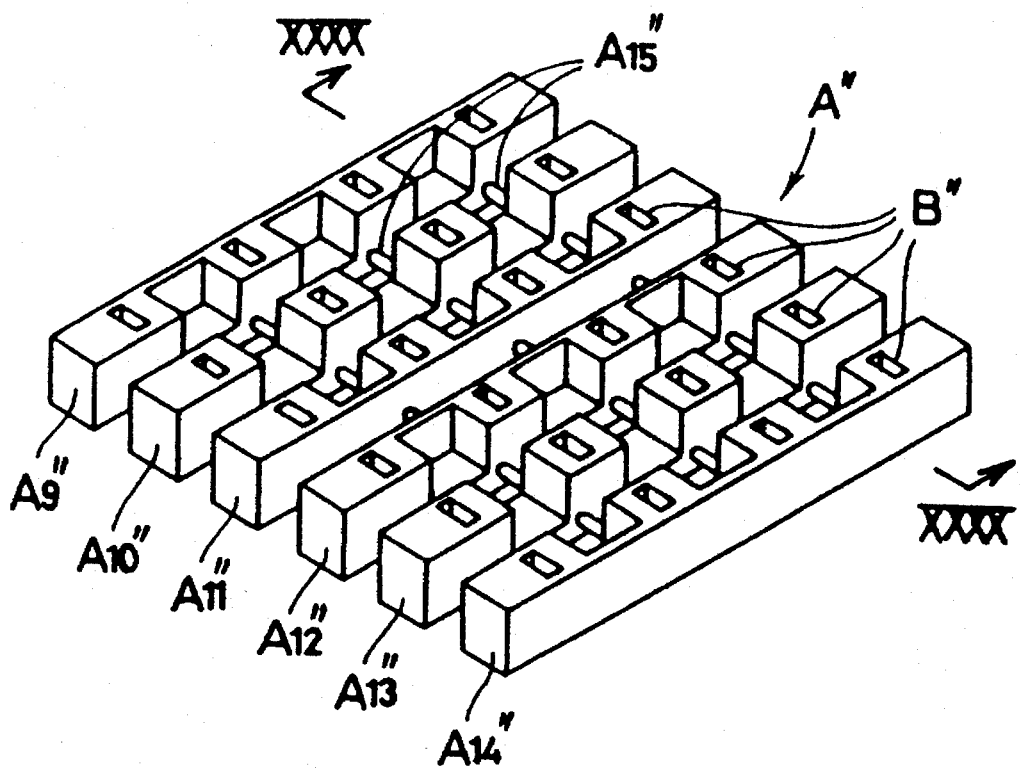
FIG. 39 is a perspective view showing another intermediate master package frame obtained by primary molding and used for making a plurality of complete package bodies.
Figure 40:
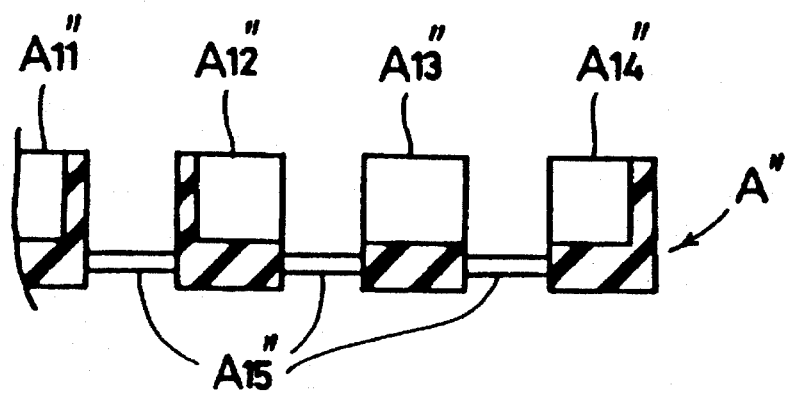
FIG. 40 is a sectional view taken along lines XXXX—XXXX in FIG. 39.
Figure 41:
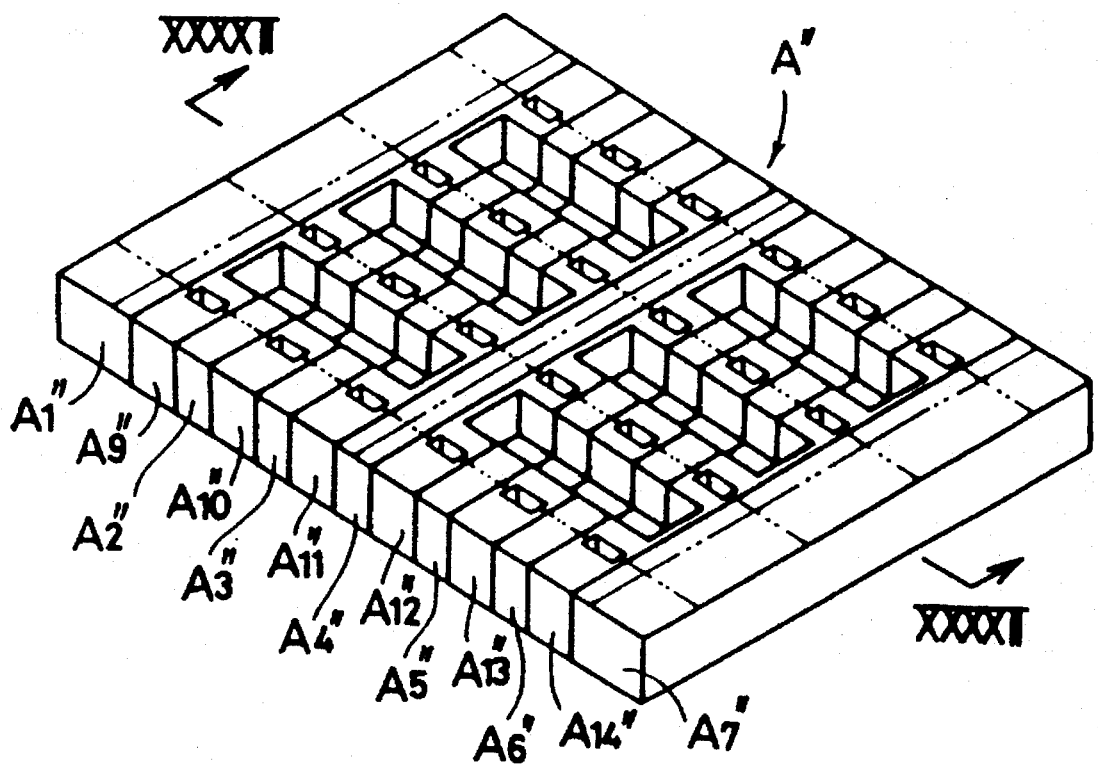
FIG. 41 is a perspective view showing another complete master package plate obtained by secondary molding.
Figure 42:
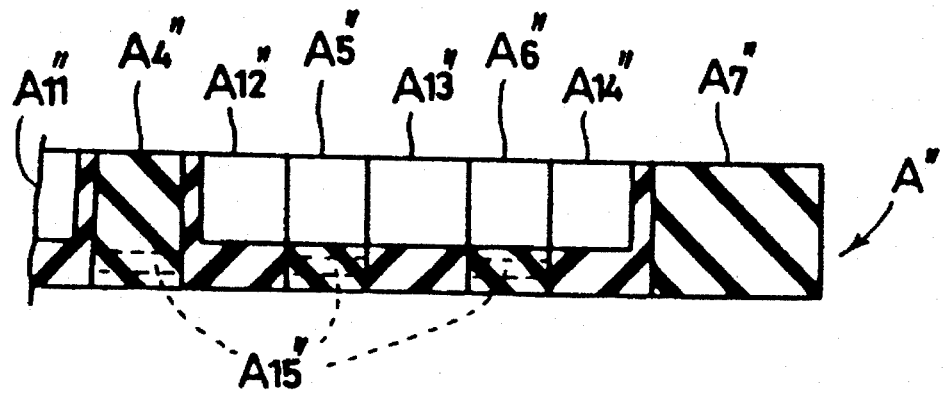
FIG. 42 is a sectional view taken along lines XXXXII—XXXXII in FIG. 41.

Alternatively, a plurality of electrode forming bars A9"–A14", which are connected together by a plurality of connector rod portions A15", are first formed of a platable resin by a primary molding, as shown in FIGS. 39 and 40. The primary molding is followed by secondary molding for forming a plurality of non-electrode forming bars A1"–A7" by injecting a platable resin, thereby providing a master package plate A", as shown in FIGS. 41 and 42. The master package plate A" is subjected to subsequent process steps (as already described) for providing a plurality of packaged piezoelectric oscillators.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

We claim:

1. A method of making packaged piezoelectric oscillators comprising the steps of:

preparing a resinous master package plate formed with a plurality of upwardly open housing grooves, each of the housing grooves being flanked by at least first and second pairs of through-holes penetrating the master package plate, the first and second pairs of through-holes being located at positons corresponding to both ends of said each housing groove, said each housing groove having an intermediate wider width portion, each end of the housing groove being provided with a pair of end positioning walls projecting toward each other for providing a narrower width portion between the pair of end positioning walls;

forming first and second lead electrodes extending on upper and lower surfaces of the master package plate transversely of said each housing groove respectively at the first and second pairs of through-holes, the first and second lead electrodes further extending respectively within the first and second pairs of through-holes, the first and second lead electrodes further extending into said each housing groove;

forming oscillator electrodes on a bottom surface of said each housing groove respectively at both ends thereof in electrical conduction with the first and second lead electrodes;

mounting a piezoelectric element in said each housing groove in electrical conduction with the respective oscillator electrodes;

attaching a master lid plate to the master package plate to close said each housing groove; and cutting the master package plate together with the attached master lid plate to provide a plurality of packaged piezoelectric oscillators.

2. The method according to claim 1, wherein the preparation of the master package plate comprises a primary molding step of forming a plurality of electrode forming portions made of a metal-platable resin and spaced from each other, and a secondary molding step of forming a plurality of non-electrode forming portions made of a non-platable resin and arranged alternately with the electrode forming portions, the respective lead electrodes and the oscillator electrodes being formed by plating the electrode forming portions with a metal.

3. The method according to claim 1, wherein the preparation of the master package plate comprises a primary molding step of forming a plurality of non-electrode forming portions made of a non-platable resin and spaced from each other, and a secondary molding step of forming a plurality of electrode forming portions made of a metal-platable resin and arranged alternately with the electrode forming portions, the respective lead electrodes and the oscillator electrodes being formed by plating the electrode forming portions with a metal.

4. A method of making packaged piezoelectric oscillators comprising the steps of:

preparing a resinous master package plate formed with a plurality of upwardly open housing grooves, each of the housing grooves being flanked by first to third pairs of through-holes penetrating the master package plate, the first and second pairs of through-holes being located at positions corresponding to both ends of said each housing groove, the housing groove having an intermediate wider width portion, the third pair of through-holes being located between the first and second pairs of through-holes;

forming first to third lead electrodes extending on upper and lower surfaces of the master package plate transversely of said each housing groove respectively at the first to third pairs of through-holes, the first to third lead electrodes further extending respectively within the first to third pairs of through-holes, the first and second lead electrodes further extending into said each housing groove;

forming oscillator electrodes on a bottom surface of said each housing groove respectively at both ends thereof in electrical conduction with the first and second lead electrodes;

mounting a piezoelectric element in said each housing groove in electrical conduction with the respective oscillator electrodes;

preparing a master lid plate having a lower surface formed with first to third capacitor electrodes in corresponding relation to the first to third lead electrodes for said each housing groove;

attaching the master lid plate to the master package plate to bring the first to third capacitor electrodes into electrical conduction with the first to third lead electrodes; and cutting the master package plate together with the attached master lid plate to provide a plurality of packaged piezoelectric oscillators.

5. The method according to claim 4, wherein the preparation of the master package plate comprises a primary molding step of forming a plurality of electrode forming portions made of a metal-platable resin and spaced from each other, and a secondary molding step of forming a plurality of non-electrode forming portions made of a non-platable resin and arranged alternately with the electrode forming portions, the respective lead electrodes and the oscillator electrodes being formed by plating the electrode forming portions with a metal.

6. The method according to claim 4, wherein the preparation of the master package plate comprises a primary molding step of forming a plurality of non-electrode forming portions made of a non-platable resin and spaced from each other, and a secondary molding step of forming a plurality of electrode forming portions made of a metal-platable resin and arranged alternately with the electrode forming portions, the respective lead electrodes and the oscillator electrodes being formed by plating the electrode forming portions with a metal.

7. A method of making packaged electronic components comprising the steps of:

preparing a resinous master package plate formed with a plurality of upwardly open housing grooves, each of the housing grooves being flanked by at least first and second pairs of through-holes penetrating the master package plate, the first and second pairs of through-holes being located at positions corresponding to both ends of said each housing groove;

forming first and second lead electrodes extending on upper and lower surfaces of the master package plate transversely of said each housing groove respectively at the first and second pairs of through-holes, the first and second lead electrodes further extending respectively within the first and second pairs of through-holes, the first and second lead electrodes further extending into said each housing groove;

forming element electrodes on a bottom surface of said each housing groove respectively at both ends thereof in electrical conduction with the first and second lead electrodes;

mounting an electronic element in said each housing groove in electrical conduction with the respective element electrodes;

attaching a master lid plate to the master package plate to close said each housing groove; and cutting the master package plate together with the attached master lid plate to provide a plurality of packaged electronic components.

* * * * *